United States Patent
Lo et al.

(10) Patent No.: US 7,659,981 B2
(45) Date of Patent: *Feb. 9, 2010

(54) APPARATUS AND METHOD FOR PROBING INTEGRATED CIRCUITS USING POLARIZATION DIFFERENCE PROBING

(75) Inventors: William Lo, San Jose, CA (US); Kenneth Wilsher, Palo Alto, CA (US); Nagamani Nataraj, Cupertino, CA (US); Nina Boiadjieva, Belmont, CA (US)

(73) Assignee: DCG Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/261,996

(22) Filed: Oct. 27, 2005

(65) Prior Publication Data

US 2007/0046947 A1   Mar. 1, 2007

Related U.S. Application Data

(60) Provisional application No. 60/711,998, filed on Aug. 26, 2005.

(51) Int. Cl.
*G01B 11/00*   (2006.01)
(52) U.S. Cl. .................................................. 356/369
(58) Field of Classification Search ................ 356/491, 356/492, 369
See application file for complete search history.

(56) References Cited

U.S. PATENT DOCUMENTS

| | | | |
|---|---|---|---|
| 3,524,694 A | 8/1970 | Klein et al. | |
| 3,711,186 A | 1/1973 | O'Connor | |
| 3,912,378 A | 10/1975 | Goto | |
| 4,297,032 A | 10/1981 | Temple | |
| T102,104 I4 | 8/1982 | Kirk et al. | |
| 4,353,618 A | 10/1982 | Hagner et al. | |
| 4,555,767 A | 11/1985 | Case et al. | |
| 4,588,950 A | 5/1986 | Henley | |
| 4,615,620 A | 10/1986 | Noguchi et al. | |

(Continued)

OTHER PUBLICATIONS

Weingarten et al, Picosecond Optical Sampling of GaAs Integrated Circuits, IEEE Journal of Quantum Electronics, vol. 24, No. 2, Feb. 1988, pp. 198-220.*

(Continued)

*Primary Examiner*—Samuel A Turner
(74) *Attorney, Agent, or Firm*—Nixon Peabody LLP; Joseph Bach, Esq.

(57) ABSTRACT

A system for probing a DUT is disclosed, the system having a pulsed laser source, a CW laser source, beam optics designed to point a reference beam and a probing beam at the same location on the DUT, optical detectors for detecting the reflected reference and probing beams, and a collection electronics. The beam optics is a common-path polarization differential probing (PDP) optics. The common-path PDP optics divides the incident laser beam into two beams of orthogonal polarization—one beam simulating a reference beam while the other simulating a probing beam. Both reference and probing beams are pointed to the same location on the DUT. Due to the intrinsic asymmetry of a CMOS transistor, the interaction of the reference and probing beams with the DUT result in different phase modulation in each beam. This difference can be investigated to study the response of the DUT to the stimulus signal.

30 Claims, 13 Drawing Sheets

U.S. PATENT DOCUMENTS

| | | | |
|---|---|---|---|
| 4,625,114 A | 11/1986 | Bosacchi et al. | |
| 4,634,234 A | 1/1987 | Baumann | |
| 4,680,635 A | 7/1987 | Khurana | |
| 4,681,449 A | 7/1987 | Bloom et al. | |
| 4,698,587 A | 10/1987 | Burns et al. | |
| 4,721,910 A | 1/1988 | Bokor et al. | |
| 4,724,322 A | 2/1988 | Knowles et al. | |
| 4,736,159 A | 4/1988 | Shiragasawa et al. | |
| 4,758,092 A | 7/1988 | Heinrich et al. | |
| 4,758,786 A | 7/1988 | Hafeman | |
| 4,811,090 A | 3/1989 | Khurana | |
| 4,908,568 A | 3/1990 | Gerald | |
| 4,956,603 A | 9/1990 | Russo | |
| 4,968,932 A | 11/1990 | Baba et al. | |
| 5,004,307 A | 4/1991 | Kino et al. | |
| 5,010,945 A | 4/1991 | Burke | |
| 5,087,121 A | 2/1992 | Kakuchi et al. | |
| 5,164,664 A | 11/1992 | Soelkner | |
| 5,208,648 A | 5/1993 | Batchelder et al. | |
| 5,220,403 A | 6/1993 | Batchelder et al. | |
| 5,247,392 A | 9/1993 | Plies | |
| 5,282,088 A | 1/1994 | Davidson | |
| 5,334,540 A | 8/1994 | Ishii | |
| 5,412,328 A | 5/1995 | Male et al. | |
| 5,430,305 A | 7/1995 | Cole, Jr. et al. | |
| 5,453,994 A | 9/1995 | Kawamoto et al. | |
| 5,457,536 A | 10/1995 | Kornfield et al. | |
| 5,465,043 A * | 11/1995 | Sakai | 324/753 |
| 5,475,316 A | 12/1995 | Hurley et al. | |
| 5,493,236 A | 2/1996 | Ishii et al. | |
| 5,532,607 A | 7/1996 | Inuzuka et al. | |
| 5,532,873 A | 7/1996 | Dixon | |
| 5,854,804 A | 12/1998 | Winer et al. | |
| 5,872,360 A | 2/1999 | Paniccia et al. | |
| 5,905,577 A * | 5/1999 | Wilsher et al. | 324/752 |
| 5,930,588 A | 7/1999 | Paniccia | |
| 5,940,545 A | 8/1999 | Kash et al. | |
| 5,969,517 A * | 10/1999 | Rao | 324/96 |
| 6,072,179 A | 6/2000 | Paniccia et al. | |
| 6,168,311 B1 | 1/2001 | Xiao et al. | |
| 6,188,705 B1 * | 2/2001 | Krainak et al. | 372/32 |
| 6,251,706 B1 | 6/2001 | Paniccia | |
| 6,252,222 B1 | 6/2001 | Kasapi et al. | |
| 6,252,412 B1 | 6/2001 | Talbot et al. | |
| 6,297,651 B1 * | 10/2001 | Akikuni et al. | 324/753 |
| 6,445,198 B1 * | 9/2002 | Akikuni et al. | 324/753 |
| 6,452,378 B1 * | 9/2002 | Toriyama et al. | 324/97 |
| 6,462,814 B1 | 10/2002 | Lo | |
| 6,509,750 B1 | 1/2003 | Talbot et al. | |
| 6,591,121 B1 | 7/2003 | Madarasz et al. | |
| 6,594,086 B1 | 7/2003 | Pakdaman et al. | |
| 6,605,951 B1 | 8/2003 | Cowan | |
| 6,621,275 B2 | 9/2003 | Cotton et al. | |
| 6,720,588 B2 | 4/2004 | Vickers | |
| 6,778,327 B2 | 8/2004 | Pakdaman et al. | |
| 6,788,396 B2 | 9/2004 | Stolte et al. | |
| 6,797,581 B2 | 9/2004 | Vickers | |
| 6,798,562 B2 | 9/2004 | Hakimi et al. | |
| 6,812,464 B1 | 11/2004 | Sobolewski et al. | |
| 6,836,131 B2 | 12/2004 | Cader et al. | |
| 6,897,664 B1 | 5/2005 | Bruce et al. | |
| 2004/0001255 A1 * | 1/2004 | Fratello | 359/484 |

OTHER PUBLICATIONS

Yee, W.M., et al., "Laser Voltage Probe (LVP); A Novel Optical Probing Technology for Flip-Chip Packaged Microprocessors," *Conference Proceedings from the 26th International Symposium for Testing and Failure Analysis (ISFTA)*, Nov. 12-16, 2000, pp. 3-8.

Kolachina, S., et al., "Optical Waveform Probing—Strategies for Non-Flipchip Devices and Other Applications," *Conference Proceedings from the 37th International Symposium for Testing and Failure Analysis (ISFTA)*, Nov. 11-15, 2001, pp. 51-57.

International Search Report for PCT/US07/11790 dated Feb. 14, 2008.

Paniccia, Mario, et al., "Novel Optical Probing Technique for Flip Chip Packaged Microprocessors," International Test Conference, IEEE 1998.

Eiles, Travis M., et al., "Optical Probing of VLSI IC's from the Silicon Backside," *Proceedings from the 25th International Symposium for Testing and Failure Analysis*, Nov. 14-18, 1999, pp. 27-33.

Bruce, Mike, et al., "Waveform Acquisition from the Backside of Silicon Using Electro-Optic Probing," *Proceedings from the 25International Symposium for Testing and Failure Analysis*, Nov. 14-18, 1999, pp. 19-25.

Heinrich, H.K., et al., "Picosecond Backside Optical Detection of Internal Signals in Flip-Chip Mounted Silicon VLSI Circuits," *3rd European Conference on Electron and Optical Beam Testing of Integrated Circuits*, Sep. 9-11, 1991, Como, Italy.

Black, A., et al., "Optical Sampling of GHz Charge Density Modulation in Silicon Bipolar Junction Transistors," Electronics Letters, 1987, vol. 23, No. 15, p. 783-784.

Kasapi, Steven, et al., "Laser Beam Backside Probing of CMOS Integrated Circuits," *Microelectronics Reliability*, 1999, pp. 957-961, 39.

Heinrich, H.K., et al., "Noninvasive Sheet Charge Density Probe for Integrated Silicon Devices," *Appl. Phys. Lett*. 48 (16), Apr. 21, 1986, American Institute of Physics.

Heinrich, H.K., et al., "Erratum: Noninvasive Sheet Charge Density Probe for Integrated Silicon Devices," *Appl. Phys. Lett*. 1986, 48, 1066.

Heinrich, H.K., et al., "Noninvasive Optical Sheet Charge Density Probe for Silicon Integrated Circuits," *IEEE Transactions on Electron Devices*, Nov. 1986, vol. Ed. 33 No. 11.

Hemenway, B.R., et al., "Optical Detection of Charge Modulation in Silicon Integrated Circuits Using a Multimode Laser-Diode Probe," *IEEE Electron Device Letters*, Aug. 1987, vol. EdL-8, No. 8.

Soref, Richard A., et al., "Electrooptical Effects in Silicon," *IEEE Journal of Quantum Electronics*, Jan. 1987, vol. QE-23 No. 1.

Wilsher, Kenneth R., et al., "Practical Optical Waveform Probing of Flip-Chip CMOS Devices," *ITC International Test Conference*, Paper 35.1, 1999.

Wilsher, Ken, et al., "Integrated Circuit Waveform Probing Using Optical Phase Shift Detection," *Proceedings from the 26International Symposium for Testing and Failure Analysis*, Nov. 12-16, 2000, pp. 479-485, Bellevue, Washington.

Lo, William, et al., "Polarization Difference Probing: A New Phase Detection Scheme for Laser Voltage Probing," *Proceedings from the 30th International Symposium for Testing and Failure Analysis*, Nov. 14-18, 2004, Worcester, Massachusetts.

Heinrich, H.K., "Picosecond Noninvasive Optical Detection of Internal Electrical Signals in Flip-Chip-Mounted Silicon Integrated Circuits," *IBM J. Res. Development*, Mar./May 1990, vol. 34. No. 2/3.

Mertin, W., et al., "Contactless Gigahertz Testing," Gerhard-Mercator-Universität Duisburg, 1998.

Buller, G.S., et al., "All-Solid-State Microscope-Based System for Picosecond Time-Resolved Photoluminescence Measurements on II-VI Semiconductors," *Rev. Sci. Instrum*. 63 (5), May 1992, American Institute of Physics.

Charbonneau, S., et al., "Two-Dimensional Time-Resolved Imaging with 100-ps Resolution Using a Resistive Anode Photomultiplier Tube," *Rev. Sci. Instrum*., 63 (11), Nov. 1992, American Institute of Physics.

Buller, G.S., et al., "Time-resolved Photoluminescence Measurements of InGaAs/InP Multiple-Quantum-Well Structures at 1.3-μm Wavelengths By Use of Germanium Single-Photon Avalanche Photodiodes," *Applied Optics*, Feb. 20, 1996, pp. 916- 921, vol. 35, No. 6.

Kudva, S.M., "The Sematech Failure Analysis Roadmap," *ISTFA '95, 21st International Symposium for Testing and Failure Analysis*, Nov. 6-10, 1995, pp. 1-5, Santa Clara, California.

Restle, Philip, et al., "Internal Probing of Submicron FETs and Photoemission Using Individual Oxide Traps," *IBM Journal of Research and Development*, Mar./May 1990, pp. 227-241, vol. 34, No. 2/3.

Cole, Edward I., Jr., et al., "Novel Failure Analysis Techniques Using Photo Probing With a Scanning Optical Microscope," *IEEE/IRPS*, 1994, pp. 388-398.

Esfahani, Farzad, et al., "Testability Improvement of Highly Integrated Circuits by Optical Injection of Logical Levels into the Circuit," Institut für Mikroelektronik, Technische Universität Berlin, pp. 288-295, 1997.

Bergner, H., et al., "Dynamic Laser Beam Testing of a n-MOS Device," *Microelectronic Engineering*, 15 (1991), pp. 109-112, Elsevier Science Publishers B.V.

Bergner, Harald, et al., "A Time-Resolved Optical Beam Induced Current Method," *Microelectronic Engineering*, 12 (1990), pp. 143-148, Elsevier Science Publishers B.V.

Bergner, H., et al., "Identification of Hot Spots in Integrated Circuits by Laser Scanning Microscopy," *Microelectronic Engineering*, 14 (1991), pp. 121-131, Elsevier Science Publishers, B.V.

Nikawa, K., et al., "Verification and Improvement of the Optical Beam Induced Resistance Change (OBIRCH) Method," *Proceedings of the 20th International Symposium for Testing and Failure Analysis*, Nov. 13-18, 1994, pp. 11-16.

Nikawa, Kiyoshi, et al., "LSI Failure Analysis Using Focused Laser Beam Heating," pp. 307-312, 1992.

Nikawa, Kiyoshi, et al., "New VLSI Failure Analysis Method Using Infrared Laser Beam.", 1992.

Nikawa, Kiyoshi, et al., "Various Contrasts Identifiable from the Backside of a Chip by 1.3µm Laser Beam Scanning and Current Change Imaging," *Proceedings ISTFA*, Nov. 20, 1996, pp. 1-6.

Nikawa, Kiyoshi, et al., "New Laser Beam Heating Methods Applicable to Fault Localization and Defect Detection in VLSI Devices," *IEEE*, 1996, pp. 346-354.

Xu, Chris, et al., "Two-Photon Optical Beam Induced Current (OBIC) Imaging Through the Backside of Integrated Circuits," Murray Hill, New Jersey, 1997.

Gutkin, A.A., et al., "Influence of the Orientation of the Electric Field on the Polarization Dependence of on the Electroabsorption in Silicon," *Soviet Physics Semiconductors*, Dec. 1974, pp. 781-782, vol. 8, No. 6.

Gutkin, A.A., et al., "Influence of the Polarization of Light on the Electroabsorption in Silicon," *Soviet Physics—Semiconductors*, Mar. 1973, pp. 1524-1527, vol. 6, No. 9.

Fan, H.Y., et al., "Infra-Red Absorption of Silicon," *Letters to the Editor*, Feb. 24, 1950, p. 178.

Duckworth, Henry E., et al., "Masses of $Cr^{50}$, $Cr^{52}$, and $Fe^{54}$," *Letters to the Editor*, Feb. 28, 1950, p. 179.

Chester, Marvin, et al., "Electroabsorption Spectrum in Silicon," *Physical Review Letters*, Aug. 10, 1964, pp. 193-195, vol. 13, No. 6.

Anderson, P.W., et al., "Radio-Frequency Effects in Superconducting Thin Film Bridges," *Physical Review Letters*, Aug. 10, 1964, vol. 13, No. 6.

Redfield, David, "Effect of Defect Fields on the Optical Absorption Edge," *Physical Review*, May 1, 1963, pp. 916-918, vol. 130, No. 3.

Frova, A., et al., "Electro-Absorption Effects at the Band Edges of Silicon and Germanium," *Physical Review*, May 13, 1966, pp. 575-583, vol. 145, No. 2.

Valdmanis, Janis A., et al., "Subpicosecond Electrical Sampling," *IEEE Journal of Quantum Electronics*, Apr. 1983, pp. 664-667, vol. QE-19, No. 4.

Löffler, T., et al., "Stable Optoelectronic Detection of Free-Running Microwave Signals with 150-GHz Bandwidth," *Microelectronic Engineering*, 1996, pp. 397-408, 31, Elsevier Science B.V.

Heinrich, H.K., et al., "Measurement of Real-Time Digital Signals in a Silicon Bipolar Junction Transistor Using a Noninvasive Optical Probe," *IEEE Electronics Letters*, Jun. 5, 1986, pp. 650-652, vol. 22, No. 12.

Falk, Dr. R. Aaron, "IVT Imagery," OptoMetrix, Inc, 1990.

Kash, J.A., et al., "Full Chip Optical Imaging of Logic State Evolution in CMOS Circuits," *IEDM*, 1996, Late News Paper.

Tsang, J.C., et al., "Picosecond Hot Electron Light Emission from Sub-Micron Complementary Metal Oxide Semiconductor Circuits," *Applied Physics Letters*, Feb. 17, 1997, 70(7), American Institute of Physics.

Kume, H., et al., "Ultrafast Microchannel Plate Photomultipliers," *Applied Optics*, Mar. 15, 1988, pp. 1170-1178, vol. 27, No. 6.

Khurana, N., et al., "Analysis of Product Hot Electron Problems by Gated Emission Microscopy," *IEEE/IRPS*, 1986, pp. 189-194.

Weingarten, Kurt J., et al., "Picosecond Optical Sampling of GaAs Integrated Circuits," *IEEE Journal of Quantum Electronics*, Feb. 1988, pp. 198-205, vol. 24, No. 2.

\* cited by examiner

US 7,659,981 B2

APPARATUS AND METHOD FOR PROBING INTEGRATED CIRCUITS USING POLARIZATION DIFFERENCE PROBING

CROSS-REFERENCE TO RELATED APPLICATION

This application claims the benefit of priority to U.S. Provisional Patent Application No. 60/711,998 filed on Aug. 26, 2005, under the same title, the entire disclosure of which is relied upon and incorporated by reference herein.

BACKGROUND

1. Field of the Invention

The present invention relates to an apparatus and method for probing integrated circuits using laser illumination.

2. Description of the Related Art

Probing systems have been used in the art for testing and debugging integrated circuit (IC) designs and layouts. Various laser-based systems for probing IC's are known in the prior art. While some description of the prior art is provided herein, the reader is encouraged to also review U.S. Pat. Nos. 5,208,648, 5,220,403 and 5,940,545, which are incorporated herein by reference in their entirety. Additional related information can be found in Yee, W. M., et al. *Laser Voltage Probe (LVP): A Novel Optical Probing Technology for Flip-Chip Packaged Microprocessors*, in International Symposium for Testing and Failure Analysis (ISTFA), 2000, p 3-8; Bruce, M. et al. *Waveform Acquisition from the Backside of Silicon Using Electro-Optic Probing*, in International Symposium for Testing and Failure Analysis (ISTFA), 1999, p 19-25; Kolachina, S. et al. *Optical Waveform Probing—Strategies for Non-Flipchip Devices and Other Applications*, in International Symposium for Testing and Failure Analysis (ISTFA), 2001, p 51-57; Soref, R. A. and B. R. Bennett, *Electrooptical Effects in Silicon*. IEEE Journal of Quantum Electronics, 1987. QE-23(1): p. 123-9; Kasapi, S., et al., *Laser Beam Backside Probing of CMOS Integrated Circuits*. Microelectronics Reliability, 1999. 39: p. 957; Wilsher, K., et al. *Integrated Circuit Waveform Probing Using Optical Phase Shift Detection*, in International Symposium for Testing and Failure Analysis (ISTFA), 2000, p 479-85; Heinrich, H. K., *Picosecond Noninvasive Optical Detection of Internal Electrical Signals in Flip-Chip-Mounted Silicon Integrated Circuits*. IBM Journal of Research and Development, 1990. 34(2/3): p. 162-72; Heinrich, H. K., D. M. Bloom, and B. R. Hemenway, *Noninvasive sheet charge density probe for integrated silicon devices*. Applied Physics Letters, 1986. 48(16): p. 1066-1068; Heinrich, H. K., D. M. Bloom, and B. R. Hemenway, *Erratum to Noninvasive sheet charge density probe for integrated silicon devices*. Applied Physics Letters, 1986. 48(26): p. 1811.; Heinrich, H. K., et al., *Measurement of real-time digital signals in a silicon bipolar junction transistor using a noninvasive optical probe*. IEEE Electron Device Letters, 1986. 22(12): p. 650-652; Hemenway, B. R., et al., *Optical detection of charge modulation in silicon integrated circuits using a multimode laser-diode probe*. IEEE Electron Device Letters, 1987. 8(8): p. 344-346; A. Black, C. Courville, G Schultheis, H. Heinrich, *Optical Sampling of GHz Charge Density Modulation in SIlicon Bipolar Junction Transistors* Electronics Letters, 1987, Vol. 23, No. 15, p. 783-784, which are incorporated herein by reference in their entirety.

As is known, during debug and testing of an IC, a commercially available Automated Testing Equipment, also known as an Automated Testing and Evaluation (ATE) tester, is used to generate test patterns (also referred to as test vectors) to be applied to the IC device under test (DUT). When a laser-based system is used for probing, the DUT is illuminated by the laser and the light reflected from the DUT is collected by the probing system. As the laser beam strikes the DUT, the laser beam is modulated by the response of various elements of the DUT to the test vectors. This has been ascribed to the electrical modulation of the free carrier density, and the resultant perturbation of the index of refraction, of the material. Accordingly, analysis of the reflected light provides information about the operation of various devices in the DUT.

FIG. 1 is a general schematic depicting major components of a laser-based voltage probe system architecture, 100, according to the prior art. In FIG. 1, dashed arrows represent optical path, while solid arrows represent electronic signal path. The optical paths represented by curved lines are generally made using fiber optic cables. Probe system 100 comprises a dual laser source, DLS 110, an optical bench 112, and data acquisition and analysis apparatus 114. The optical bench 112 includes provisions for mounting the DUT 160. A conventional ATE tester 140 provides stimulus signals and receives response signals 142 to/from the DUT 160 and provides trigger and clock signals, 144, to the time-base board 155. The time-base board 155 synchronizes the signal acquisition with the DUT stimulus and the laser pulses. Workstation 170 controls as well as receives, processes, and displays data from the signal acquisition board 150, time-base board 155, and the optical bench 112.

The various elements of probe system 100 will now be described in more detail. Since temporal resolution is of high importance in testing DUT's, the embodiment of FIG. 1 utilizes prior art pulsed lasers, wherein the laser pulse width determines the temporal resolution of the system. Dual laser source 110 consists of two lasers: a pulsed mode-locked laser, MLL 104, source that is used to generate 10-35 ps wide pulses, and a continuous-wave laser source, CWL 106, that can be externally gated to generate approximately 1 µs wide pulses. The MLL 104 source runs at a fixed frequency, typically 100 MHz, and must be synchronized with the stimulus 142 provided to the DUT 160, via a phase-locked loop (PLL) on the time-base board 155, and the trigger and clock signals 144 provided by the ATE tester. The output of the DLS 110 is transmitted to the optical bench 112 using fiber optics cable 115. The light beam is then manipulated by beam optics 125, which directs the light beam to illuminate selected parts of the DUT 160. The beam optics 125 consists of a Laser Scanning Microscope (LSM 130) and beam manipulation optics (BMO 135). The specific elements that are conventional to such an optics setup, such as objective lens, etc., are not shown. Generally, BMO 135 consists of optical elements necessary to manipulate the beam to the required shape, focus, polarization, etc., while the LSM 130 consists of elements necessary for scanning the beam over a specified area of the DUT. In addition to scanning the beam, the LSM 130 has vector-pointing mode to direct the laser beams to anywhere within the field-of-view of the LSM and Objective Lens. The X-Y-Z stage 120 moves the beam optics 125 relative to the stationary DUT 160. Using the stage 120 and the vector-pointing mode of the LSM 130, any point of interest on the DUT 160 may be illuminated and probed.

For probing the DUT 160, the ATE 140 sends stimulus signals 142 to the DUT, in synchronization with the trigger and clock signals provided to the phase-locked loop on the time-base board 155. The phase-lock loop controls the MLL 104 to synchronize its output pulses to the stimulus signals 142 to the DUT. MLL 104 emits laser pulses that illuminate a particular device of interest on the DUT that is being stimulated. The reflected light from the DUT is collected by the beam optics 125, and is transmitted to photodetector 138 via fiber optic cable 134. The reflected beam changes character depending on the reaction of the device to the stimulus signal. To monitor incident laser power, for purposes of compensating for laser power fluctuations, for example, optical bench 112 provides means to divert a portion of MLL 104 incident pulse to photodetector 136 via fiber optic cable 13. The output signal of the photodetectors 132, 134 is sent to signal acquisition board 150, which, in turn, sends the signal to the controller 170. By manipulation of the phase lock loop on the time-base board 155, controller 170 controls the precise time position of MLL 104 pulses with respect to DUT 160 stimulus signals 142. By changing this time position and monitoring the photodetectors signals, the controller 170 can analyze the temporal response of the DUT to the stimulus signals 142. The temporal resolution of the analysis is dependent upon the width of the MLL 104 pulse.

A major difficulty encountered by all laser-base probe systems is deciphering the weak modulation in the reflected signal, which is caused by the response of the DUT to the stimulus. Another difficulty is noise introduced into the signal by the DUT's vibrations. Various beam manipulation optic, 135, designs have been used in the art in an attempt to solve these difficulties. FIG. 2 is a diagram illustrating standard amplitude detection mode used in the prior art. In FIG. 2, a laser probe is used to probe specific device 210, such as a transistor's gate or drain, in a DUT. A beam splitter 220 is used to separate the reflected beam from the incident laser beam. Amplitude modulation due to DUT interaction with the laser beam can be detected directly using a photodetector. However, DUT vibrations cause amplitude variations that are much stronger than the variation from the DUT activity of interest. This necessitates noise rejection schemes to make such an arrangement practical. One scheme implemented in the prior art is dual-laser noise rejection. In dual-laser noise rejection, the pulses from CWL 106 are used to measure the DUT 160 vibrations. The CWL measurements are then used to normalize the MLL measurements of the DUT activity.

The DUT interaction with the laser beam may cause changes mostly in the phase of the reflected laser beam, not its amplitude. Consequently, the signal strength may be too weak for pure amplitude detection. Various phase detection schemes have been developed for the beam manipulation optics 135. FIG. 3 is a diagram illustrating a phase detection scheme using a Michelson Interferometer arrangement to convert phase to amplitude. This scheme is also referred to as Phase-Interferometric Detection, or PID, mode. To detect phase modulations, a portion of the incident beam from the laser source is directed into a reference arm consisting of a lens 340 and a mirror 330, using beam splitter 320. The remaining portion of the incident beam is directed to a specific device of interest on the DUT, and upon reflection it is modulated according to the DUT's response to a stimulus signal. The light beam, 355, reflected by the DUT, and the light beam, 335, reflected by the reference arm mirror 330, are spatially recombined into a single beam 365 so that they can interfere (light beams 355 and 335 are shown spatially separated in FIG. 3 for illustrative purposes). The interference effect converts relative phase differences between the reflected beam 355 and the reference arm beam 335 into amplitude differences in resultant beam 365, which can then be detected by a photodetector.

While this arrangement helps detect phase variations caused by the DUT, using this optical arrangement exposes the system to additional noise source from phase variations caused by DUT vibrations. The DUT vibrations still modulate reflected DUT beam amplitude, but now also modulate the DUT beam phase, which generates larger resultant beam 365 amplitude modulations. To compensate for this phase noise, a modified dual-laser noise rejection scheme is used. In this modified scheme, the CWL resultant signal is used in a feedback loop to control reference arm mirror 330 position. By striving to maintain constant CWL resultant signal, the feedback loop drives reference arm mirror 330 to track DUT vibrations in order to maintain a constant quiescent phase offset value between DUT and reference arms. Fine control of mirror 330 position for the feedback loop is provided via a piezo electric transducer element (not shown). Additional adjustments (not shown) that are required in order to get best performance include reference arm power control and coarse reference arm mirror position control. Reference arm power control allows the reflected power from the DUT and reference arm mirror to be matched. Coarse reference arm mirror position control allows DUT and reference arm optical path lengths to be nominally equalized, a necessity for the operation of the modified dual-laser noise reduction scheme due to wavelength differences between MLL and CWL used in the prior art. Means to align optics to ensure overlap of reflected DUT and reference arm beams are also necessary for best performance.

FIG. 4 is a diagram illustrating another scheme, generally known as (spatial) differential probing (SDP) for phase detection. A Wollaston prism, contained within beam manipulation optics 430, is used to generate the two spatially separated beams, 422, 424. The two beams, 422 and 424, have orthogonal, linear polarization states (denoted by the dots and arrows of beams 424 and 422, respectively). One beam, e.g., 422, is directed to the DUT active device of interest; while the other beam, say, 424, can be directed to either an inactive device or region, or to an active device with complementary modulation. The advantage of the latter option is that the measured signal modulation is increased because the relative phase modulation between the two beams is doubled. In the particular example of FIG. 4, the two beams are directed to the drains of the p- and n- FETs of an inverter, which generates complementary modulations of the beam. Beam manipulation optics 430 spatially recombines the two reflected beams, 435, 455, and converts them to the same polarization state so that they may interfere with each other to generate amplitude modulated resultant beam 465. Beam manipulation optics 430 also provides means to introduce a phase offset between the two beams so that the interference condition can be optimized for maximum signal sensitivity. Using this scheme the phase noise is reduced relative to the scheme illustrated in FIG. 3, because each beam is directed at the DUT, so that the DUT vibrations will tend to modulate the phase of both beams similarly.

As can be understood, various IC's have different layouts, and different devices within an IC's have different dimensions and surroundings. Therefore, using this embodiment, for each device to be probed the user needs to decide where to place each beam within the chip. Moreover, since the beam needs to be placed at various locations in the chip, the system needs to be designed so that the beam separation is adjustable, which complicates the optics design. Additionally, the intensity ratio of the beams must be variable since the reflectivity of the regions where they are placed can differ. Power matching between the two beams is required for best results.

Experience with devices as depicted in FIG. 4 has shown that DUT vibrations can still generate amplitude fluctuations if the two laser beams are not incident on identical structures. Due to variations in the layout and dimensions of the DUT, it is difficult to find identical structures for probing within the range of adjustment of the two laser beams. Differences in structure cause differences in reflection as the DUT is vibrated. To reduce the effects of these vibrations, the dual-laser noise reduction scheme can be used. However, the different polarization states of the two beams also makes them respond differently to time-varying birefringence in the DUT or in the optics of the system. Time varying birefringence in the DUT can be caused by stress variations due to mechanical vibrations, for example.

FIG. 5 is a diagram illustrating time differential probing (TDP) scheme for phase detection. Two pulsed beams, 522 and 524, are generated by splitting a single pulse beam in two and time shifting one relative to the other by a small amount (approx. 10-100 ps) before DUT interaction. Time shifting can be achieved by passing one beam through an optical delay line (such as a thick piece of glass) contained within beam manipulation optics, 526. The two beams are spatially recombined after splitting so that they traverse a common path to the DUT. After DUT reflection, the opposite beam is passed through the optical delay line to remove the relative delay between the two beams. The two beams are then allowed to interfere, 530. Since the two beams traverse a common path, DUT vibrations largely modulate both identically, making this scheme inherently vibration insensitive. However, the optics required to generate the delay, and then reverse its effect for the reflected beams, are relatively complicated. Additionally, the beams are not completely identical. They have orthogonal polarization states so DUT interactions are not truly identical (birefringence effects can cause non-common mode variations of the beams). In this scheme, the resulting 'waveforms' are derivatives of the signal at the probed device in the DUT and typically consist of positive and negative going peaks in the case of probed logic signals, for example. When both beams are position in time on logic highs or lows, the resultant beam intensity is the same since both beams are phase shifted identically in each case. Only when the time shifted beams span a logic transition (one beam on a logic high, the other beam on a logic low) or part of a logic transition, does a phase difference result. This arrangement requires high temporal resolution of the sampling to ensure that each logic transition of interest is spanned by the time separated beams. This can limit the maximum time span of a sampling window that can be used, or may require additional acquisition time to fill the desired sampling window with enough density of sampling points. In addition, the temporal resolution (or measurement bandwidth) of this scheme is limited by the pulse separation used instead of by the width of the laser pulses. Since larger pulse separations typically give better signal strength, this scheme suffers from a measurement bandwidth versus signal strength trade-off.

Accordingly, there is a need in the art for a system that will allow improved laser probing of a DUT, while simplifying operation and minimizing the system's complexity and cost.

SUMMARY

Various embodiments of the present invention provide apparatus and method for laser probing of a DUT at very high temporal resolution, while pointing both laser beams at the same location on the DUT.

In one aspect of the invention, a system for probing a DUT is provided, the system comprising a mode-locked laser source, a CW laser source, beam optics designed to point a reference beam and a probing beam at the same location on the DUT, optical detectors for detecting the reflected reference and probing beams, and signal processing electronics.

In various illustrative implementations the beam optics comprise a common-path polarization differential probing (PDP) optics. The common-path PDP optics divides the incident laser beam into two beams of orthogonal polarization— one beam simulating a reference beam while the other simulating a probing beam. Both reference and probing beams are pointed to the same location on the DUT. Due to the intrinsic asymmetry of a CMOS transistor, the interaction of the reference and probing beams with the DUT result in different phase modulation in each beam. This difference can be investigated to study the response of the DUT to the stimulus signal.

Various embodiments of the invention also provide for a Laser Scanning Microscope (LSM) operable in a scanning mode and a vector-pointing mode. The scanning mode is used to obtain an image of an area of the DUT for navigation purposes, while the vector-pointing mode is used to park the beams on a specific device for probing.

In another embodiment of the invention, a system for testing an integrated circuit (IC) stimulated to simulate operating conditions is provided. The system includes a navigation light path and a probing light path. A first illumination source is used in the navigation mode to obtain an image of a specified area of the DUT via the navigation light path. Then, the light path is switched to the probing mode and a second light source is used to probe the DUT. The second light source may be a mode-locked laser light source and the probing light path may include the common-path PDP optics. The probing light path may further include a solid immersion lens (SIL).

According to one aspect of the invention, a system for testing an integrated circuit microchip using laser probing is provided, which comprises a mode-locked laser source providing a laser beam; a CW laser source providing a CW laser beam, a beam optics receiving the laser beams from the laser sources and providing a first and a second orthogonally polarized beams; a beam pointing optics receiving the first and second orthogonally polarized beams and pointing the first and second orthogonally polarized beams onto the same point on the microchip; a first photodetector receiving reflected laser light that is reflected from the microchip and providing an electrical signal; collection electronics receiving the electrical signal from the photodetector and providing an output signal; and an analysis system receiving and analyzing the output signal.

According to another aspect of the invention, a method of testing an integrated circuit microchip is provided, the method comprising generating a mode-locked laser beam; transferring the laser beam through optical elements so as to obtain a reference beam polarized in one direction and a probing beam polarized in an orthogonal direction to the one direction; pointing the reference beam and the probing beam at a common selected area on the microchip; and collecting and analyzing reflected light that is reflected from the selected area.

According to yet another aspect of the invention, an interferometer system is provided, comprising a mode-locked laser source providing a laser beam; a polarizer polarizing the laser beam in a first direction; a Faraday rotator rotating the beam to align its polarization in a second direction, so as to effectively produce a first polarized beam aligned in said first direction and a second polarized beam aligned in a third direction that is orthogonal to the first direction; an optical retarder, retarding one of the first and second polarized beams; and an objective lens directing the first and second polarized beams onto a common point on a specimen.

According to a further aspect of the invention a system for investigating the operation of an integrated circuit microchip using laser probing is provided. The system comprises a laser source providing a laser beam; a beam optics comprising a polarizer polarizing the beam in a first direction so as to provide a polarized beam, and a rotator rotating the polarized beam through a predetermined angle so as to provide a polarization-rotated beam consisting of a first and a second orthogonally polarized beams; a beam pointing optics receiving the first and second orthogonally polarized beams and pointing the first and second orthogonally polarized beams onto the same point on the microchip; a first photodetector receiving reflected laser light that is reflected from said microchip and providing an electrical signal; collection electronics receiving the electrical signal from the photodetector and providing an output signal; and an analysis system receiving and analyzing said output signal.

According to yet further embodiment of the invention, an interferometer system is provided, comprising a laser source providing a laser beam; a polarizer receiving the laser beam and providing a polarized laser beam aligned in a first direction; a faraday rotator receiving the polarized laser beam and rotating the polarized laser beam to provide a rotated-polarized beam aligned in a second direction; an optical retarder partially retarding the rotated-polarized beam; an objective lens directing the rotated-polarized beam onto a specimen; and an optical deflector for deflecting at least part of a reflection of the rotated-polarized beam from the specimen.

According to another aspect of the invention, a method for investigating the operation of an integrated circuit microchip using laser probing is provided, comprising: generating a pulsed laser beam; polarizing the pulsed laser beam in a first direction so as to provide a polarized-pulsed laser beam; rotating the polarized-laser beam so as to provide a rotated laser beam aligned in a second direction; partially retarding the rotated laser beam; focusing the rotated laser beam onto said microchip; and sensing beam reflection from the microchip.

According to various aspects of the invention a pulsed laser beam is used to probe a microchip. In various embodiments the pulsed laser beam comprises laser pulses from a mode locked laser (MLL) source superimposed over laser beam from a continuous wave laser (CWL) source. In various embodiments the CWL beam is pulsed. In some embodiments the CWL is a wavelength-tunable, external cavity laser source. According to illustrative embodiments the CWL source is constructed with a laser diode, a Bragg deflector, and a drive circuit. In some embodiments the drive circuit drives the laser diode with continuous or pulsed drive signal, selectively.

Other aspects and features of the invention will become apparent from the description of various embodiments described herein, and which come within the scope and spirit of the invention as claimed in the appended claims.

Figure 1:
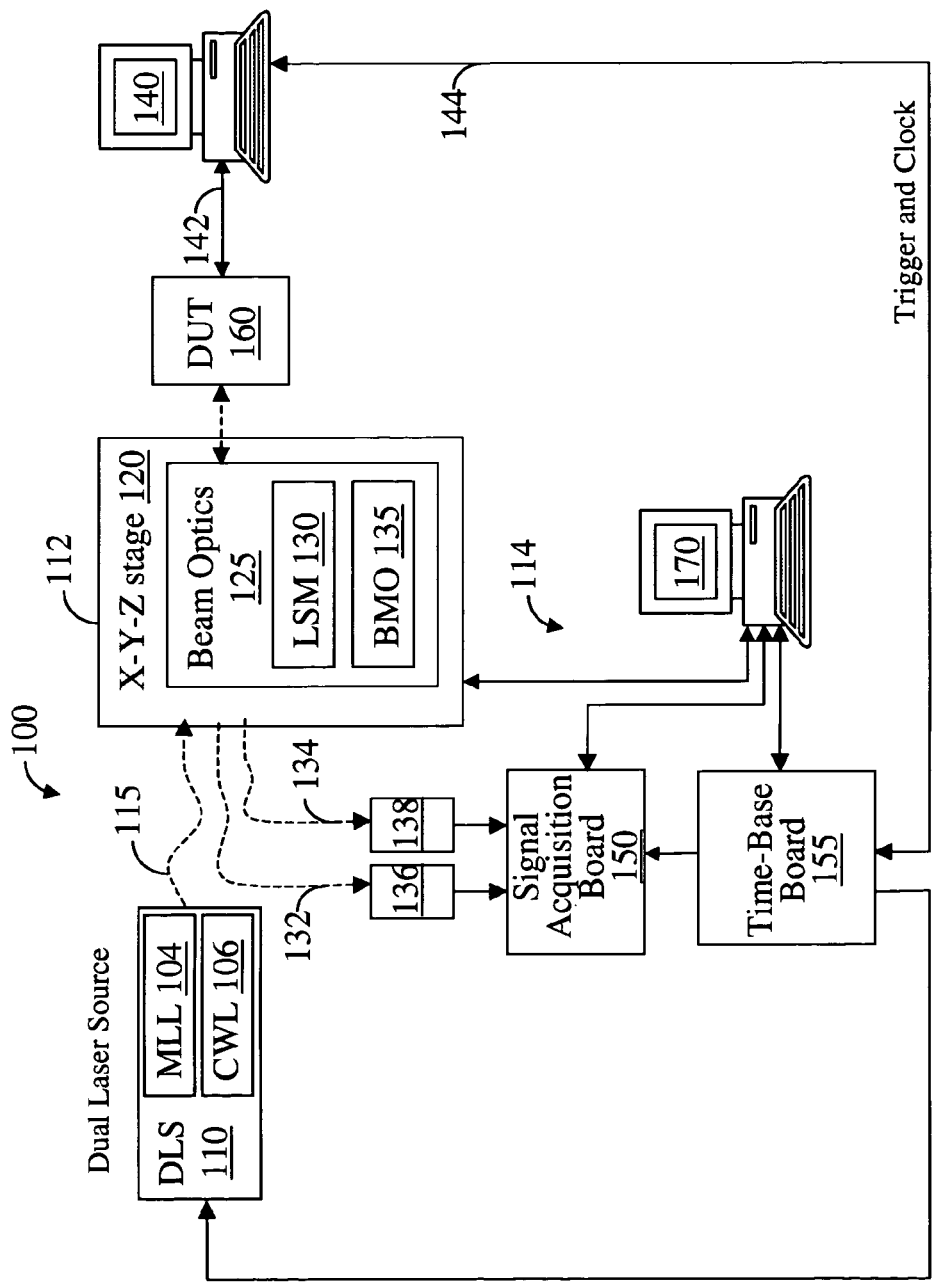
FIGS. 1 is a general schematic depicting major components of a laser-based voltage probe system architecture according to the prior art.
Figure 3:
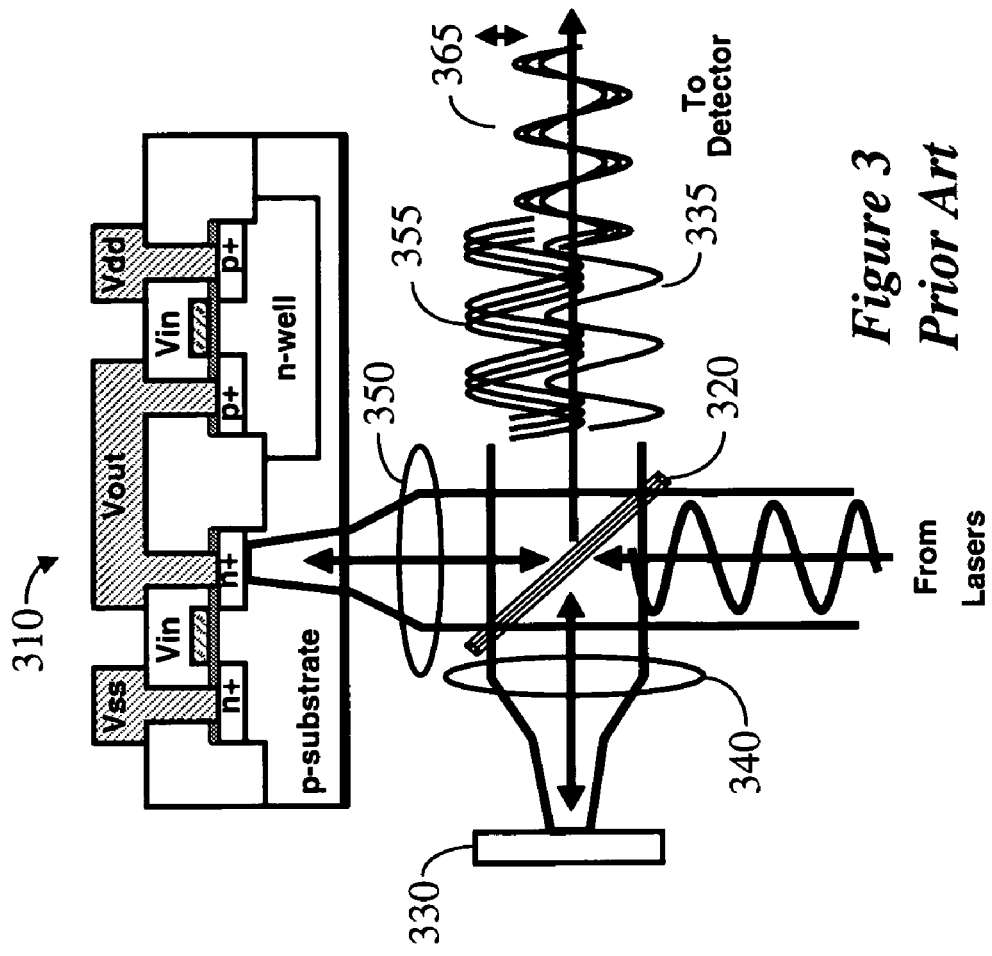
FIG. 3 is a diagram illustrating phase detection scheme with Michelson Interferometer arrangement according to the prior art.
Figure 2:
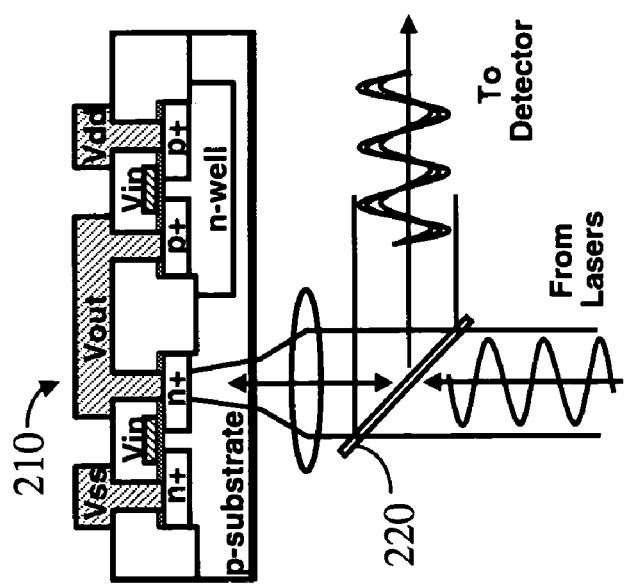
FIG. 2 is a diagram illustrating standard amplitude detection mode used in the prior art.
Figure 5:
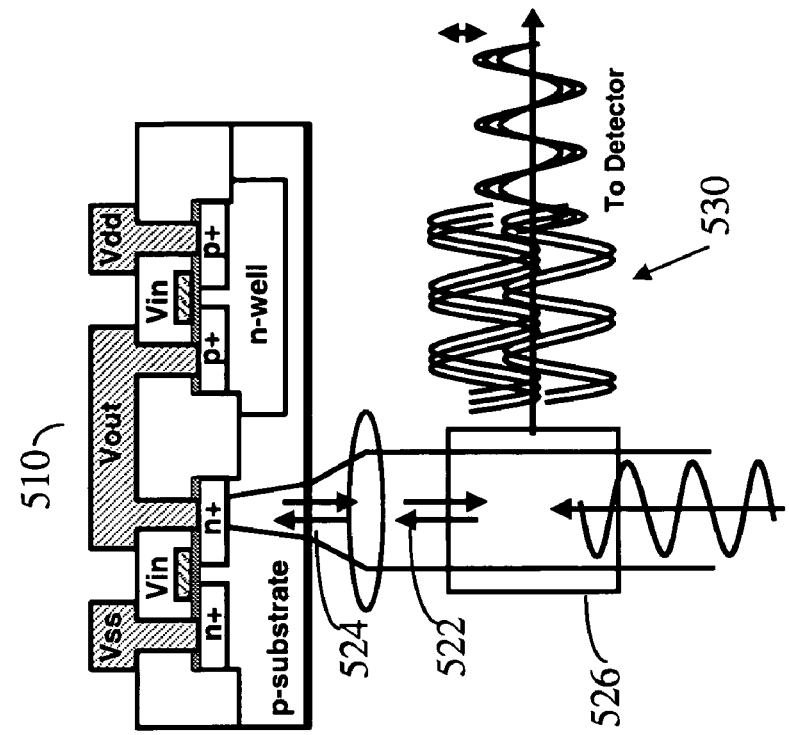
FIG. 5 is a diagram illustrating time differential probing (TDP) scheme for phase detection according to the prior art.
Figure 4:
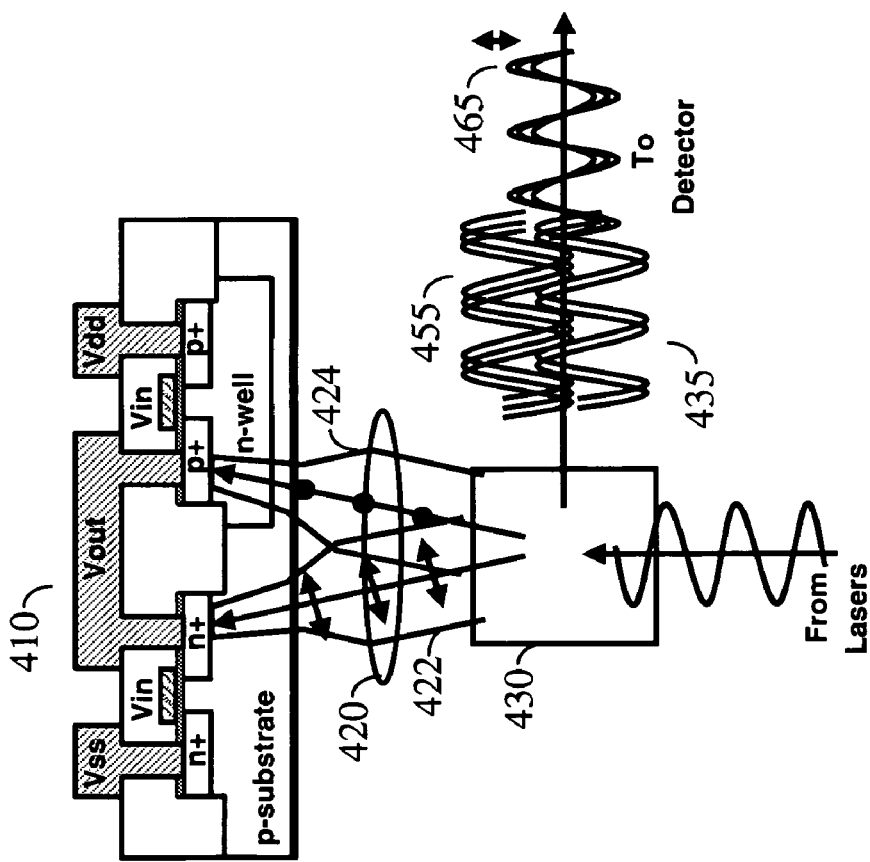
FIG. 4 is a diagram illustrating a spatial differential probing arrangement for phase detection according to the prior art.

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

An embodiment of the invention will now be described in details with reference to FIG. 6 and, for illustration purposes, it will be depicted in a manner highlighting differences from the system of FIG. 1. Most notably, in this embodiment of the invention a polarization differential probing optics, PDP 635, is used to generate two beams of orthogonal polarization orientation and point both beams at the same location on the DUT. Other differences would become apparent from the description provided below.

Figure 6:
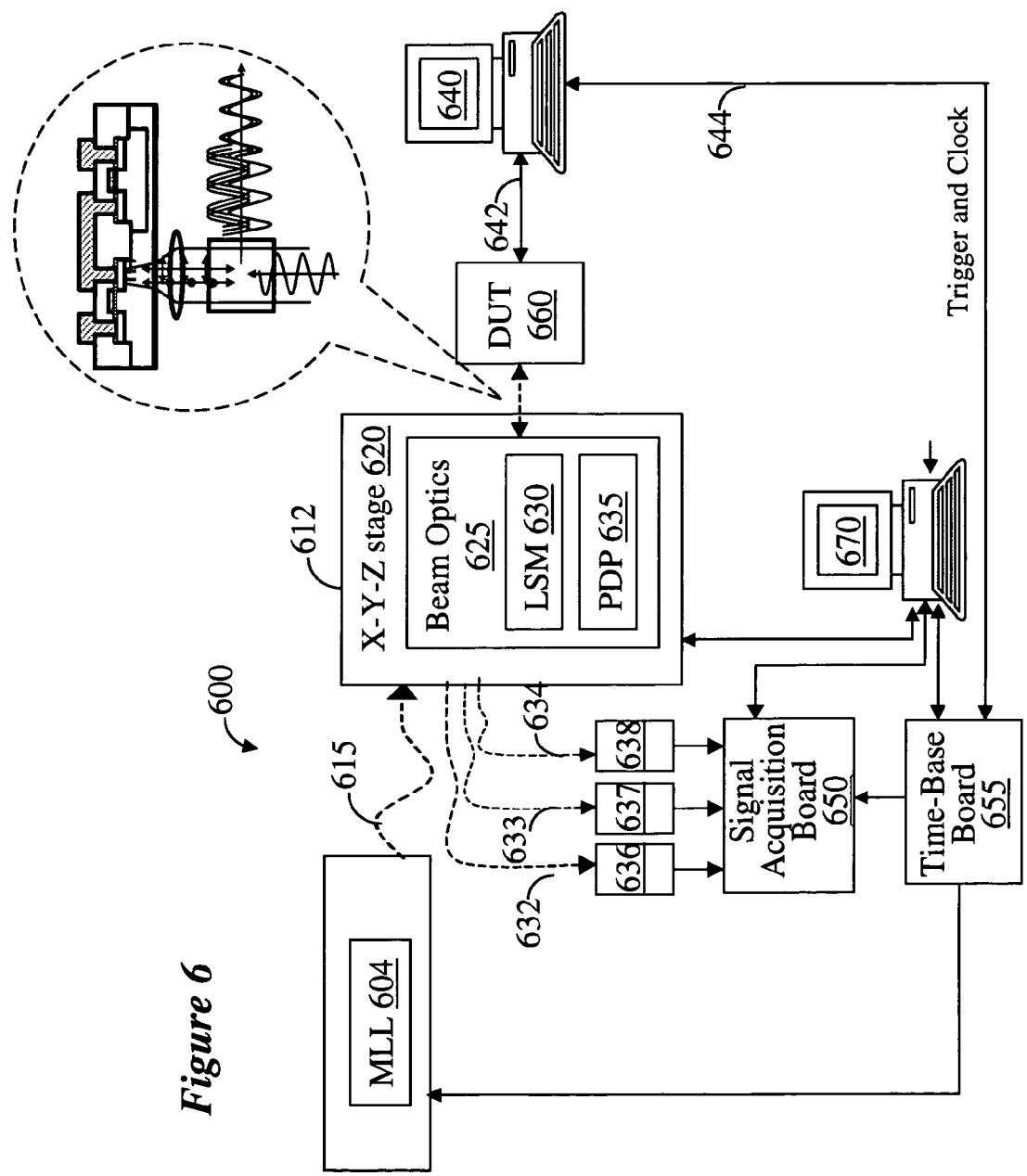
FIG. 6 depicts an embodiment of the present invention using mode-locked laser source and a common-path PDP optics.

In FIG. 6 a mode-locked laser source, MLL 604, provides pulsed laser beam. The pulses are of very short duration, e.g., 10 ps. The wavelength can be an 'invasive' wavelength such as 1064 nm, or it may be a non-invasive wavelength (>1100 nm). By 'invasive' it is meant that the laser illumination interacts, i.e., generates significant numbers of electron-hole pair, with or causes significant changes in the electrical response of the DUT. In some embodiments the laser source can also consist of multiple lasers with different wavelengths. For example, an invasive wavelength can be used in conjunction with a non-invasive, or less invasive wavelength.

In this particular embodiment, the MLL generates a polarized, pulsed laser beam that is transferred to the beam optics 625 via fiber optics 615. Of course, free-space coupling can be used instead; however, if fiber optics coupling is used, it is expected to be polarization-maintaining fiber optics. Beam optics 625 needs to deliver the laser beam to selected points within the DUT. While any optical system for pointing a beam can be used, in this embodiment this is achieved by utilizing a Laser Scanning Microscope (LSM 630). An objective lens (not shown) is typically used to generate a focused spot in the DUT. The objective can be a normal air-gap objective, a liquid immersion objective, or a solid-immersion lens (SIL) objective.

In this embodiment beam optics 625 also includes a common-path polarization differential optics PDP 635. The common-path PDP 635 provides performance improvement and better ease-of-use compared to prior art alternatives. The common-path PDP optics is described in more details below and its principle is illustrated in the broken-line circle in FIG. 6. Optics 625 is coupled to X,Y,Z stage 620 for navigation. Since movement of the optics relative to the DUT is the goal, the stage 620 can be arranged to move the optics (as shown) or it can be arranged to move the DUT. The stage 620 can be manually controlled, or electrically controlled using computer 670.

A portion of the light delivered to Beam Optics 625 is diverted to photodetector 636 via fiber optic cable 632 for purposes of monitor incident laser powers. Light reflected from the DUT is collected and applied to fiber optics 633, 634. Using one or the other of the reflected signals is also possible. Notably, using a single reflected beam enables simplifying the optics. As before, fiber coupling is optional and free-space coupling can also be used. If fibers are used, they can be single mode fiber, multimode fiber variety for maximum coupling efficiency, or they may be fiber amplifier type, to provide optical gain so as to reduce electronic noise. Other optical amplifiers may also be used. The fiber optics 633, 634, deliver the reflected light to photodetectors 637, 638. The photodetectors can be any conventional light detectors, such as PIN diode, avalanche photo diode (APD), etc. For example, an InGaAs APD with 2.5 GHz bandwidth, conventionally used by the telecom industry, can be used. APD's have internal gain and can be used so as to reduce the overall system electronic noise. The internal gain of APD's can be changed by varying the applied reverse bias voltage in order to adjust for varying levels of reflected laser power, caused by variations in reflectivity of the structures in the DUT, for example. The output signal of the photodetectors 637, 638 is collected by the signal acquisition board 650, and the output of the signal acquisition board 650 is applied to the computer 670. Notably, pulsed laser operation does not require high-bandwidth electronics to achieve high bandwidth measurements. The laser pulse width defines the bandwidth (time resolution) not the electronics. As a result, electronics- with bandwidth as low as several hundred kHz would provide adequate performance. More important than bandwidth in this context is the noise of the electronics, so consideration should be given for trading bandwidth to obtain lower noise.

The system of FIG. 6 can be operated in two general modes: navigation mode and data acquisition or probing mode. During navigation, the LSM is used to scan a designated area of the DUT and provide an image of that area. This image can be used for navigation, i.e., to place the laser beam at a particularly desired location or device during probing mode. As will be shown further below, using an LSM is but one method for imaging an area for the navigation function, and other methods can be used to obtain an image of a selected area. For example, an arrangement, such as a CCD camera, can be used to obtain an image of a designated area of the DUT. Once an image is acquired and a location or device to be probed is selected, the laser beam is pointed to that location using, in this embodiment, the LSM. That is, in the probing mode the LSM is not used to scan an area, but rather to "park" or "vector" the laser beam to a designated location.

During data acquisition operation, the laser beam is pointed to a particular point on the DUT, while the DUT is stimulated using various stimulus signals 642. When the test signal is applied to the illuminated device, the laser light reflected from that device is modulated by the reaction of the device to the stimulating signal. The reflected laser light is then collected and analyzed by the system. When the output signal obtained by the system is faint, the stimulus signal 642 should be designed to drive the DUT in a repetitive manner so as to obtain several measurements for each desired location/device, and the resulting measurements may be averaged. The signals 642 may be as simple as power and ground plus a test signal delivered via conventional probes (not shown). Of course, for more complex ICs and more elaborate testing, an ATE tester 640 can be used to deliver complex and programmable signals 642, or the DUT can be running test signals internally and independently. Regardless of the stimulus applied, a trigger and clock signal 644 may also be provided to synchronize the time-base board 655, depending on the information sought.

The optical bench 612 may include a conventional vibration isolation system (not shown) to isolate the DUT 660 and the beam optics 625 from ambient or vibrations noise or mechanical noise generated by the ATE tester. The use of vibration isolation system may be avoided by proper optical system design. The goal is to minimize unwanted movement of the DUT 660 relative to the beam optics 625 during imaging and signal acquisition. Relative movement can cause return laser intensity variations (due to defocusing effects, for example) that degrade the signal to noise ratio (SNR) of the measurement and degrade image quality.

As can be understood, the inventive system is advantageous over the prior art system. The common-path PDP optics provides ease-of-use benefits over previous schemes, especially since both the reference and probing beams are aimed at the same location. The common-path PDP optics also reduces the sensitivity of the system to vibrations, as both the reference and probing beams traverse the identical path.

Figure 7:
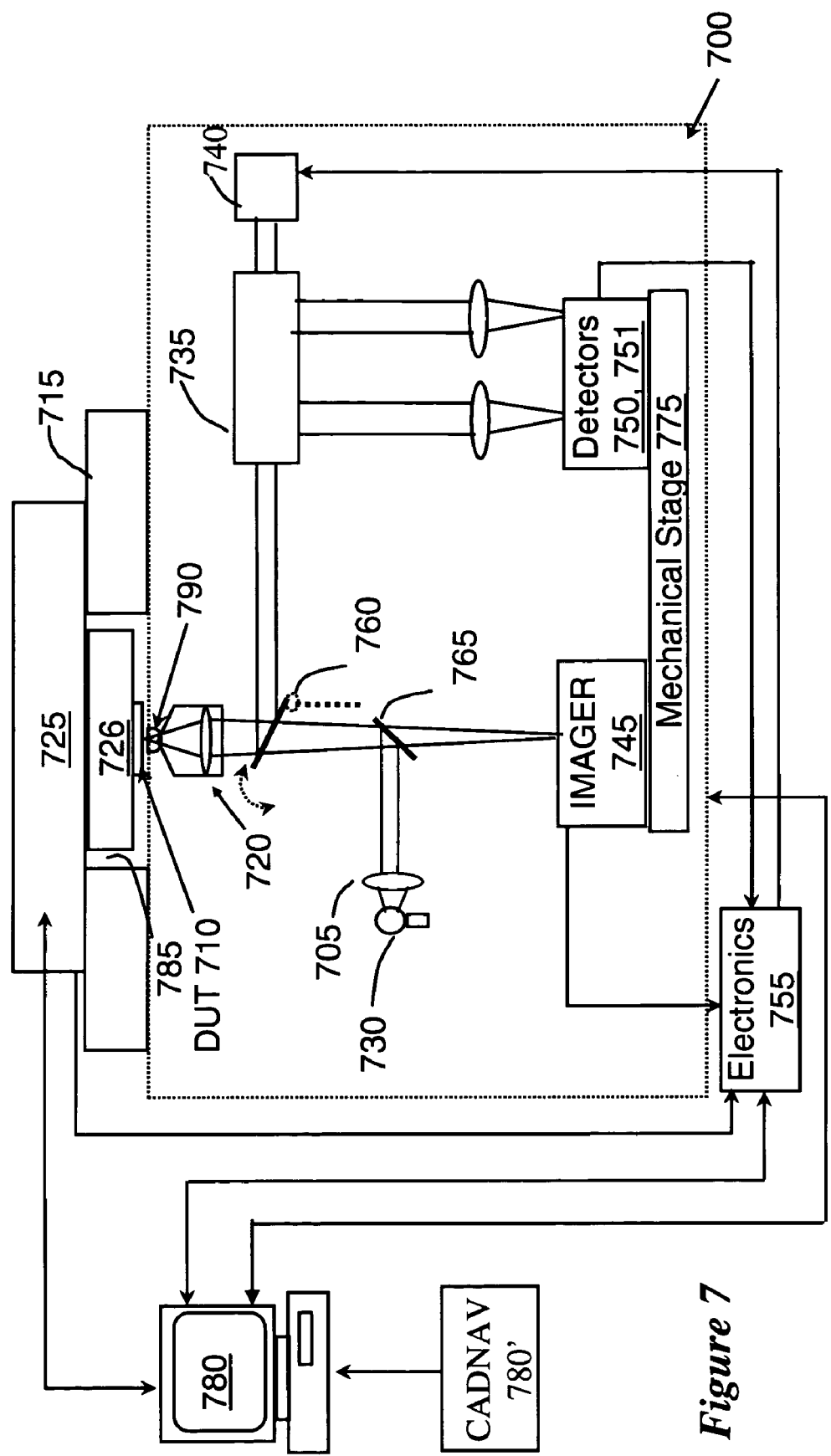
FIG. 7 depicts another embodiment of the present invention using two optical paths.

Prior to explaining the PDP optics and its operation in details, another embodiment of the testing system is provided, by way of illustrating that the PDP optics may be used in various optical systems. FIG. 7 illustrates an embodiment where the PDP optics is used in a system wherein two optical paths are provided, one for navigation and one for probing. System 700 includes a vibration isolation tabletop 715 that supports a DUT adapter 725, providing electrical connections to the DUT load board 726 onto which DUT 710 is loaded. System 700 also includes a mechanical stage 775, upon which the optical elements are assembled. In this embodiment, the optical elements are arranged so as to provide a navigation optical path and a probing optical path. To establish the navigation optical path, mirror 760 is placed in the downward pointing position, as illustrated by the broken line. With the mirror 760 in this position, the light source 730 is turned on and its light is collected by lens 705 and directed toward beam optics 720 via partially reflecting beamsplitter 765. Additionally, in this arrangement an optional solid immersion lens (SIL) 790 is added to the beam optics 720. SIL 790 may be any conventional solid immersion lens. The light flood illuminates the DUT 710 in a coaxial manner. The light returned from the DUT 710 is recollected by SIL 790 and beam optics 720 and then imaged onto imager 745, after being transmitted by partially reflecting beamsplitter 765. The imager's output signal is collected by electronics 755 and sent to computer 780, so as to provide an image of the illuminated area of the DUT. The imager 745 can be any conventional two-dimensional detector capable of imaging the DUT 710, such as, for example, vidicon camera, or a focal plane array.

The image obtained can be used for navigation and correct placement of the laser beam for probing. That is, depending on the particular test to be run, one may wish to select any particular section or device on the DUT for laser probing. Using information about the chip design and layout stored in CAD software 780', such as, for example, Cadence™, and using navigation software 780', such as, for example, Merlin's Framework™ available from Knights Technology (www.electroglass.com), one may select a particular device for any particular test and use computer 780 to place the beam at the correct location for the test.

To switch to laser probing mode, mirror 760 is flipped into the position illustrated in solid lines. In this position light source 730 is turned off and the mode locked laser source 740 is turned on. Light from MLL source 740 passes through the common patch PDP optics, 735, as described herein, and is reflected by mirror 760, so as to enter beam optics 720 and SIL 790. The laser beam is reflected by the DUT and the reflection is collected by SIL 790, the beam optics 720, deflected by mirror 760, deflected by the common path PDP optics 735, and detected by detectors 750, 751. As explained before, the reflected light is modulated by the DUT according to its response to the test signals. The output of the detectors 750, 751 are collected by the electronics 755 and sent to computer 780. For that purpose, electronics 755 includes the necessary elements as described herein, such as, e.g., differential amplifiers, balanced receiver, gated integrators, sample-and-hold electronics, analog-to-digital converters, variable gain and offset electronics, etc. The utilization of these elements will depend on the application. Additionally, as with the other embodiments described herein, if temporal resolution is needed, a synchronization signal may also be provided from the test signal generating equipment.

Figure 8:
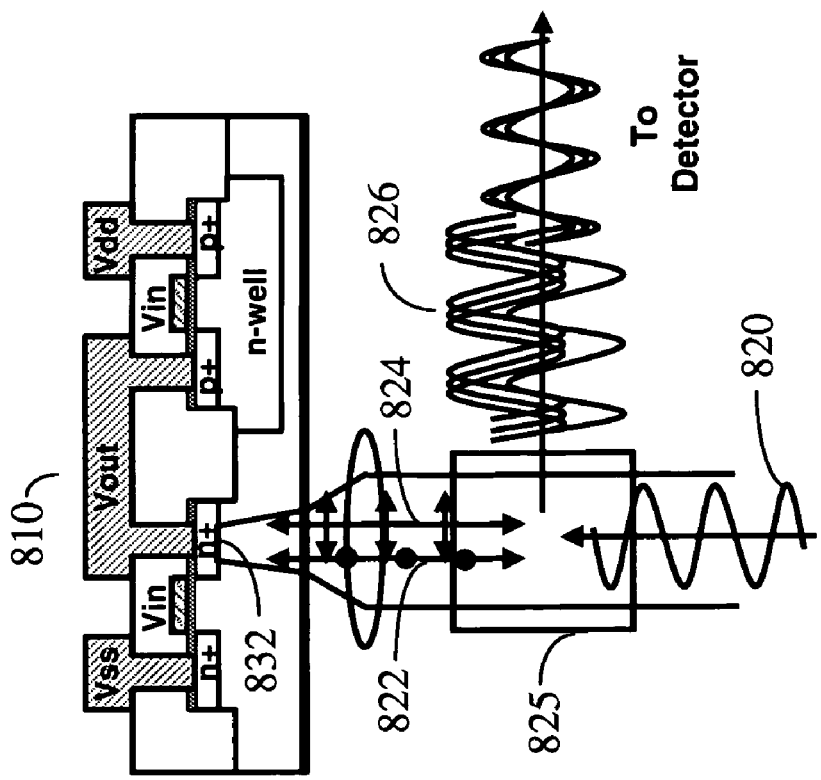
FIG. 8 is a diagram illustrating the polarization differential probing (PDP) mode for phase detection according to an embodiment of the invention.

FIG. 8 is a diagram illustrating the polarization differential probing (PDP) mode for phase detection according to an embodiment of the invention. A laser beam 820 from the mode locked laser source is split into two orthogonally polarized laser beams 822, 824, by beam optics 825. Both beams 822, 824 traverse the same optical path, but have orthogonal linear polarization states. Unlike the polarization scheme of the prior art where two different locations on the DUT are illuminated by the reference and the probing beams, in this embodiment both beams are made to be incident on the same point 832 on the DUT 810. Also unlike the polarization scheme of the prior art where the two beams are split in time, in this embodiment both beams are made to be incident on the DUT 810 at nominally the same time. For optimal effect, the polarization directions of the beams 822, 824 are aligned with the transistor gate width and length directions in the DUT 810. This polarization difference results in phase modulation differences between the two beams after DUT interaction, as will be demonstrated below with reference to FIG. 9. The two beams 822, 824 are made to interfere 826 after their DUT interactions in order to convert their phase variations into amplitude variations that can be detected using photodetectors.

Figure 9:
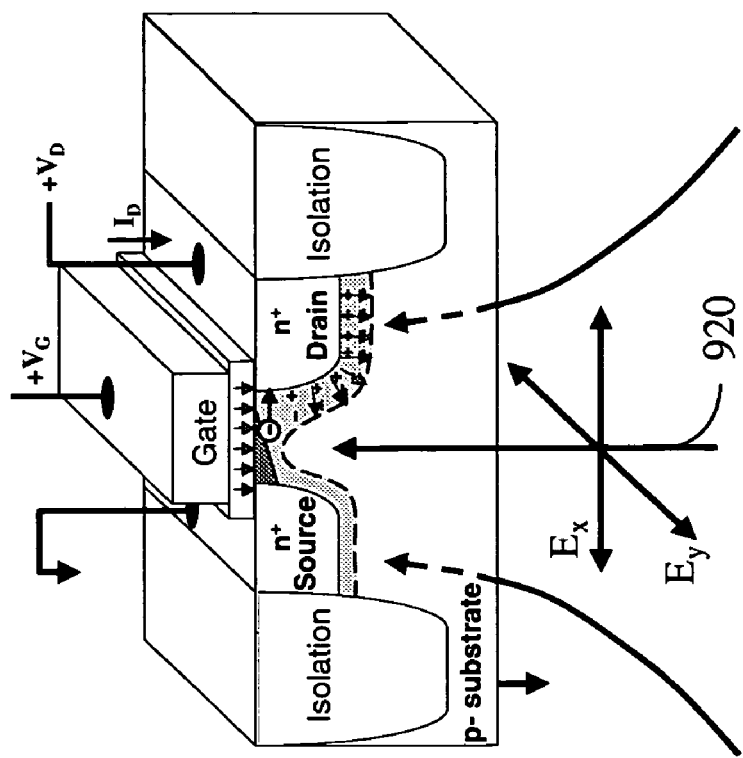
FIG. 9 is a diagram illustrating why the laser probing signal modulation is intrinsically polarization sensitive for CMOS transistors due to the intrinsic asymmetry of the CMOS device.

FIG. 9 is a diagram illustrating why the laser probing signal modulation is intrinsically polarization sensitive for CMOS transistors due to the intrinsic asymmetry of the CMOS device. A laser beam 920 is incident from the bottom (through the silicon substrate). For maximum Franz-Keldysh effect (electro-absorption/ refraction), the laser beam's polarization state should be aligned parallel to the direction of the strong modulating fields in the gate/drain regions of the transistor, i.e., along the gate length direction (along $E_x$ in FIG. 9). On the other hand, the Plasma-Optical effect requires the laser beam to drive the charge carriers induced under the gate. Since the charge carriers are less constrained in the gate width direction, a laser beam polarized along $E_y$ should be most sensitive to this effect. In practice, the laser beam is found to be most strongly modulated when its polarization vector is aligned along $E_y$. Using these effects, the present inventors realized that, unlike the prior art interferometric arrangements, the reference beam need not traverse a reference path separate from the probing path. Rather, it is possible to have both reference and probing beams traverse the same path and be pointed onto the same point on the DUT at nominally the same time, while still obtaining an interferometric effect that correlates to the DUT's response to the stimulating signal. Of course, it should be appreciated by artisans that the use here of "reference beam" and "probing beam" is for convenience purposes only, since it should be apparent that unlike the prior art, here both beams illuminate the exact same area to be investigated at nominally the same time and, therefore, in this sense, each beam can be both a reference and a probing beam.

Figure 10:
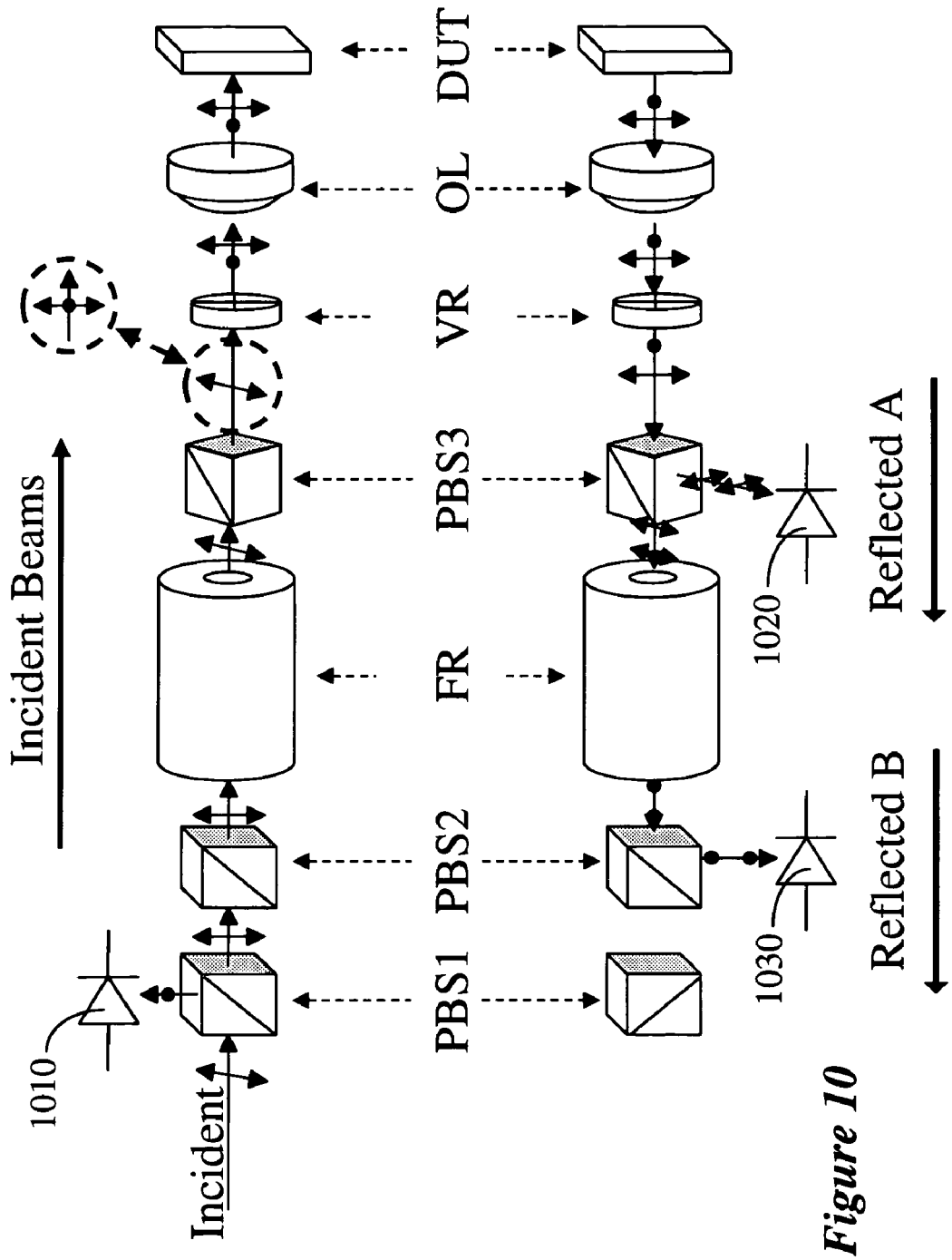
FIG. 10 is an illustration depicting one implementation of the PDP interferometer according to an embodiment of the invention.

FIG. 10 is an illustration depicting a common-path PDP optical arrangement according to an embodiment of the invention. While in actuality the incident beam and the reflected beam traverse the same elements, for better understanding the illustration is divided into two optical paths, showing each optical element twice. The top path is the incident beam path originating from the laser source, while the bottom path is the reflected beam path. The incident beam travels from left to right in the illustration. Along the beam path, vertically oriented arrows indicate a vertically polarized beam while dots indicate a horizontally polarized beam. A tilted arrow indicates a beam that is linearly polarized at some angle off the vertical. Spatial separation between a dot and an arrow depicts a phase difference between the two beams.

The beam from the laser source enters the first polarizing beam splitter PBS1 so that part of the beam is deflected towards light sensor 1010. This deflection may be set at 5% or so. The output of the sensor 1010 is used to monitor the beam's intensity and is not part of the PDP optics, but rather an optional intensity monitor. The remaining part of the beam that passes through the first PBS cube (PBS1) enters the second polarizing beam splitters PBS2, which is oriented to pass only a vertically oriented beam. The beam's polarization state is rotated a predetermined amount so as to generate a rotated polarized beam that is an equivalent of a superposition of a vertically polarized beam and a horizontally polarized beam. In this example, the beam is rotated 45 degrees from the vertical by the action of the Faraday rotator (FR) and the third PBS cube (PBS3) is oriented to transmit the rotated beam. Consequently, at this stage the beam is the equivalent of a superposition of a vertically polarized beam and a horizontally polarized beam, both beams equal in amplitude and in phase with each other. If the amplitude of the beam should not be set to equal, the rotation should be to a different angle. The dotted circles in the incident beam path, between PBS3 and VR, indicate the equivalence between a 45-degree polarized beam and two in-phase, equal amplitude beams, one polarized vertically and the other horizontally.

The two beams then enter the variable retarder VR. The fast and slow axes of the variable-retarder (VR) are aligned along these vertical and horizontal polarization directions. Thus, after passage through the VR, the beam consists of two spatially coincident, equal-amplitude, orthogonally polarized beams that are phase-shifted (retarded) with respect to each other by a small amount (nominally, π/4). This is indicated in the illustration by the dot being slightly behind the vertical arrow, representing a retardation of the horizontally polarized beam relative to the vertically polarized beam. The two beams are then focused onto the same point on the DUT by the objective lens OL. The DUT is oriented such that the polarization directions of these two beams are aligned with the length and width directions of the transistor gates. Interaction with the DUT phase modulates one of the beams relative to the other by a small amount. In this manner, the beam being modulated by the DUT may be thought of as the probing beam, while the other beam may be thought of as the reference beam. Of course, unlike prior art interferometers, here none of the beams traverses a reference optical path, but rather both beams traverse the identical path to the probing location. Therefore, in this sense, there is not reference beam and probing beam, but for convenience one may refer to one beam as the reference beam and the other as the probing beam.

After the beams are reflected by the DUT (FIG. 10, bottom) the two linearly polarized beams retrace their path to the VR. The phase modulation induced on the beams by the DUT is typically much smaller than the phase shift induced by passage through VR and so is not explicitly shown here. Passing through the VR introduces an addition phase-shift between the two returned reference and probing beams (now nominally phase-shifted by π/2). At PBS3, a portion of each beam is reflected and sent to photosensor 1020, and the other portion is transmitted. The reflected portions interfere, since they are now in the same polarization state, and generate the reflected-A signal. In one embodiment, only one photosensor 1020 is used and its output is collected by the receiver electronics and analyzed, as described in more detail below. According to another embodiment, the transmitted portions are deflected out of the beam path via the action of FR and PBS2 so as to be detected by a second photosensor 1030. The transmitted halves also interfere since they are also in the same polarization state, generating the reflected-B signal. The reflected-B signal is collected by the receiver electronics and is analyzed, as described in more details below.

An analysis of the interference condition shows that the intensity of the reflected-A signal is given by:

$$R(A) \propto (E_x/\sqrt{2})^2 + (E_y/\sqrt{2})^2 - 2[(E_x/\sqrt{2})(E_y/\sqrt{2})]\cos(\theta+\delta) \quad \text{Eqn 1.}$$

Here the θ term accounts for the static phase shift introduced by the double-pass through the variable rotator, VR, while the δ term is the small varying relative phase shift of the two beams resulting from the interaction with the DUT as it undergoes testing. Similar analysis for the reflected-B signal results in:

$$R(B) \propto (E_x/\sqrt{2})^2 + (E_y/\sqrt{2})^2 + 2[(E_x/\sqrt{2})(E_y/\sqrt{2})]\cos(\theta+\delta) \quad \text{Eqn. 2.}$$

Figure 11:
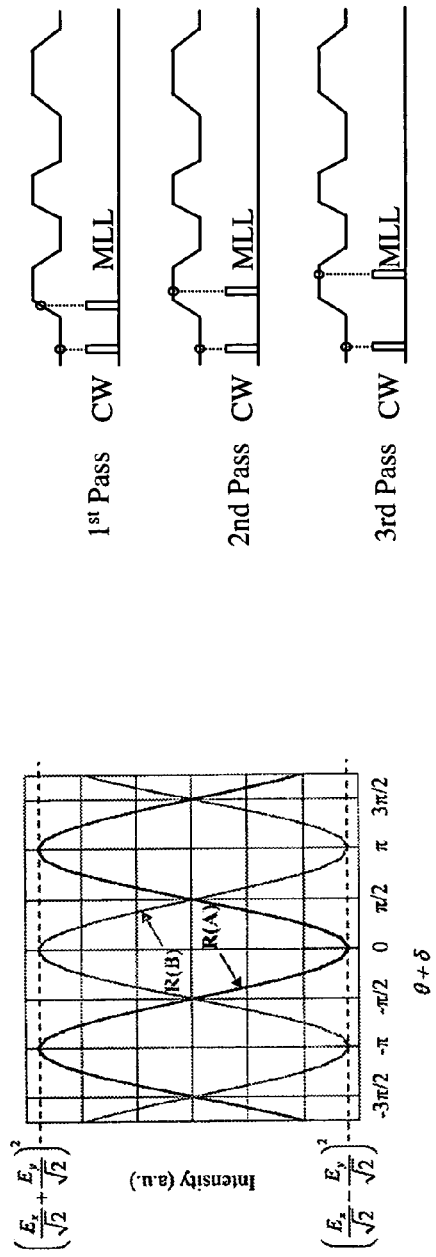
FIG. 11 is a plot illustrating the benefit of detecting both return beams of the PDP interferometer.

Eqn. 1 and Eqn. 2 are plotted in FIG. 11. From this plot, it is clear that setting the static phase shift, θ, to ±π/2 (quarter waver condition for the round trip beam) gives maximum sensitivity to changes in δ and makes the two signals nominally equal in intensity. Under this condition, Eqn. 1 and Eqn. 2 simplify, respectively, to:

$$R(A) \propto (½)E_x^2 + (½)E_y^2 + E_x E_y \sin(\delta) \quad \text{Eqn. 3.}$$

and $$R(A) \propto (½)E_x^2 + (½)E_y^2 - E_x E_y \sin(\delta) \quad \text{Eqn. 4.}$$

Then, $$R(A) - R(B) \propto 2 E_x E_y \sin(\delta) \quad \text{Eqn. 5.}$$

Thus, in principle, subtracting the two reflected signals eliminates their large DC component along with any noise it carries, such as from laser power variations, while doubling the signal modulation. Consequently an improved signal to noise ratio (SNR) is provided when using this differential signal detection mode. In practice, digitally dividing one signal by the other instead of subtracting them is performed because it is more tolerant of unbalanced reflected signals.

As can be understood, since both reference and probing beams traverse the identical optical path and are pointed to the same location on the DUT at nominally the same time, it means that,this scheme has better phase noise immunity then prior art interferometric systems. Notably, both beams are subject to the same vibrations and optical losses. This eliminates or reduces the need for active vibration compensation, path length matching, and power matching of the two arms of the interferometer. Additionally, there is no need to find a second location for the reference beam for each location tested. Rather, both beams are always pointed at the location to be tested. Accordingly, there is also no need to introduce separate spatial control of the reference and probing beams. There is also no need for complicated beam time-shifting and unshifting optics and no coupling of signal strength with time resolution. Consequently, the inventive common-path PDP arrangement can be used in multiple applications where phase detection is needed and provides drastic reductions in vibration noise, reduces the system complexity, and simplifies the setup of the system.

Figure 12:
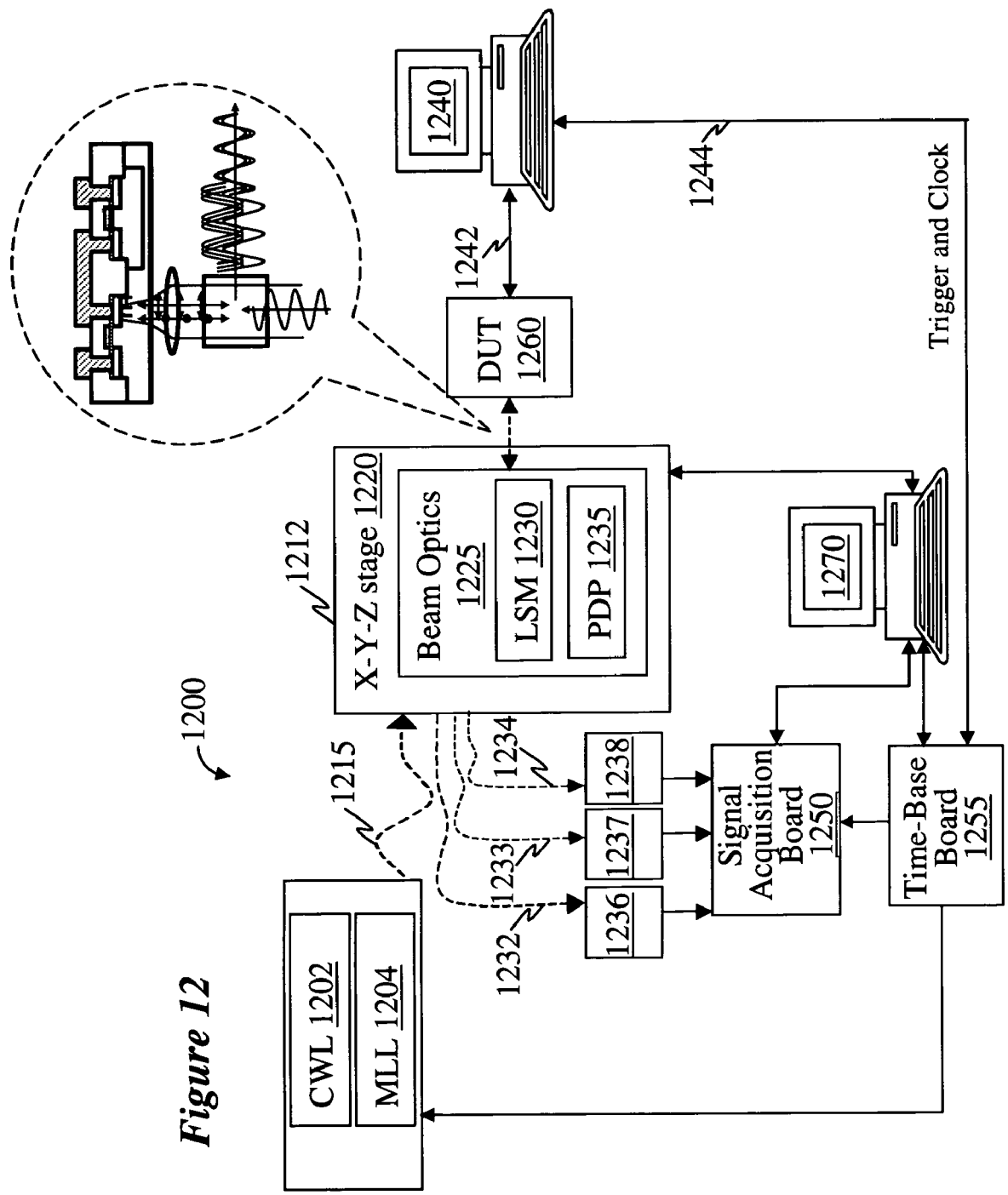
FIG. 12 depicts another embodiment of the inventive system, utilizing the PDP optics with a Mode-Locked Laser and CW sources.

While the embodiment described above provides an improved performance, time-varying birefringence effects can still degrade system performance because of the differences in polarization states between the probe and reference beams. Noise due to this time varying birefringence can be reduced, and system performance can be further improved by implementing the embodiment illustrated in FIG. 12. Notably, the elements in FIG. 12 are similar to those of FIG. 6, except that a continuous-wave laser source, CWL 1202, has been added. The output of the CW laser source 1202 is externally chopped to obtain pulses of long duration relative to that of the mode locked laser. The CW laser source may be a diode-pumped, solid state, CW laser. In this manner, an improved dual-laser noise reduction system is implemented that can reject noise due to time-varying birefringence effects. According to this system, the pulses from the mode locked laser source 1204 are used to measure the electrical activity inside the DUT, while the longer pulses obtained from the CW laser source are used to measure the birefringence noise. Noise common to both CW and MLL pulses are then eliminated from the MLL pulses by reference to the CW pulses noise measurements.

Figure 13:
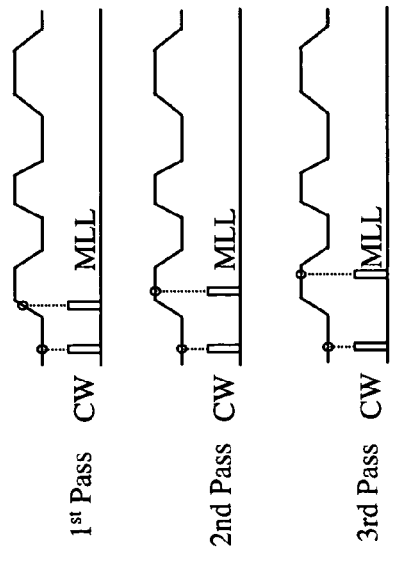
FIG. 13 illustrates an example of the dual-laser noise reduction technique.

FIG. 13 illustrates an example of the dual-laser noise reduction technique. Specifically, paired measurements are made during each repetition of the DUT signal, using sampling pulses from the two laser sources (shown to be equal width here for illustrative purposes only). In FIG. 13, three passes (or repetitions of the signal of interest) are shown. The relatively short pulse from the MLL source are swept in time through the signal of interest, in the manner of equivalent-time sampling, to measure the electrical activity of the DUT. The relatively wider sampling pulses from the CW laser source are held stationary in time with respect to the signal of interest. The CW laser pulses are thus made insensitive to the DUT electrical activity. On the other hand, time-varying birefringence affect both MLL and CW pulses nearly equally because the typical period of the birefringence effects is of the order of milliseconds, or longer, while the difference in time between CW and ML measurements for each pass can be set up to be order of microseconds. This common-mode birefringence noise can be removed from the MLL pulses by reference to the CW pulses by, for example, taking the ratio of the two signals.

Another advantage of the dual laser embodiment is that the CW laser can be used for imaging. That is, for imaging of an area of the DUT, the MLL is turned off, and the CW laser is turned on, but is not chopped. The beam from the un-chopped CW laser is then scanned over the selected area using the LSM, or any other scanning mechanism. The reflected light is used to construct an image of the scanned area.

As noted above, the MLL generates 10-35 ps wide pulses, which makes it less sensitive to inadvertent interference effects in the system's optics. For example, the coherence length of an individual 10 ps MLL pulse is about 3 mm in air and, due to the silicon's index-of-refraction, it is shortened by about 3.5 times in the DUT. Therefore, any undesired pulse reflections from various optical surfaces that are spaced apart further than half the pulse length cannot interfere.

On the other hand, the CWL pulses can have coherence length of many meters and, consequently, reflections from the ends of the optic fibers can interfere and cause non-common mode differences between the CWL and MLL signals. Such interference would degrade the effectiveness of the dual-laser noise reduction scheme since it introduces a difference between the CWL and MLL signals. To minimize this effect, it would be beneficial to have a laser source with wide spectral width in order to reduce the coherence length of the CWL pulses.

Birefringence effects are usually wavelength dependent due to variations of the index of refraction with wavelength (or, dispersion) of a material. For the best cancellation of time-varying birefringence effects using the dual-laser noise reduction scheme, the wavelengths of the MLL and CWL should be matched to match their responses to time-varying birefringence. Wavelength matching also ensures that residual interference effects caused by optical surfaces spaced within the coherence length of the laser pulses modulate both pulses in a similar manner. Therefore, the present inventors have developed a CWL source that enables better matching of birefringence and interference effects to the MLL.

Figure 14:
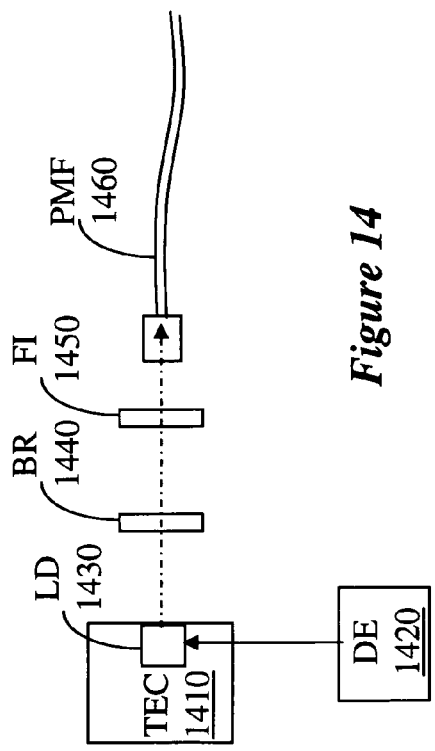
FIG. 14 is a block diagram of an embodiment of the wavelength-tunable, external-cavity, laser diode source.

FIG. 14 depicts an embodiment of a novel wavelength-tunable, external-cavity, laser diode (ECLD) source developed by the current inventors. As shown in FIG. 14, a laser diode 1430 (e.g., Part QLD-1060-50S-AR from Qphotonics of Chesapeake, Va.) is housed in an thermal-electrical-cooler (TEC) 1410 (e.g., Part PAL-TE-9.0-1060 from Optics For Research of Verona, N.J.). The front face of the laser diode 1430 has an anti-reflection coating, while the rear face has a mirror coating, so as to form one end of a laser cavity. A Bragg reflector 1440 (e.g., LuxxMaster Wavelength Stabilizer from PD-LD of Pennington, N.J.) is used as the output coupler for the external cavity laser diode source. That is, the Bragg reflector 1440 provides optical feedback into the laser diode 1430 only over a narrow wavelength band, stimulating the diode to emit over the same narrow band. The Bragg reflector is chirped along its length to allow wavelength tuning via translation of the mirror across the laser beam. An optional Faraday isolator 1450 (e.g., Optics For Research, Part IO-D-1064) is inserted in the light path of the beam to reduce unwanted optical feedback caused by reflections off the ends of the polarization-maintaining beam delivery fiber 1460 (e.g., Part PMJ-3AF3AF-980-6/125-3A-3 from Oz Optics of Ottawa, Ontario, Canada). The laser diode is driven by drive electronics 1420 in either pulsed or CW mode. The CW mode can be used, for example, for imaging. On the other hand, using pulse mode enables eliminating optical components required for externally chopping the laser output. This greatly simplifies the optical design and reduces optical losses.

Figure 16:
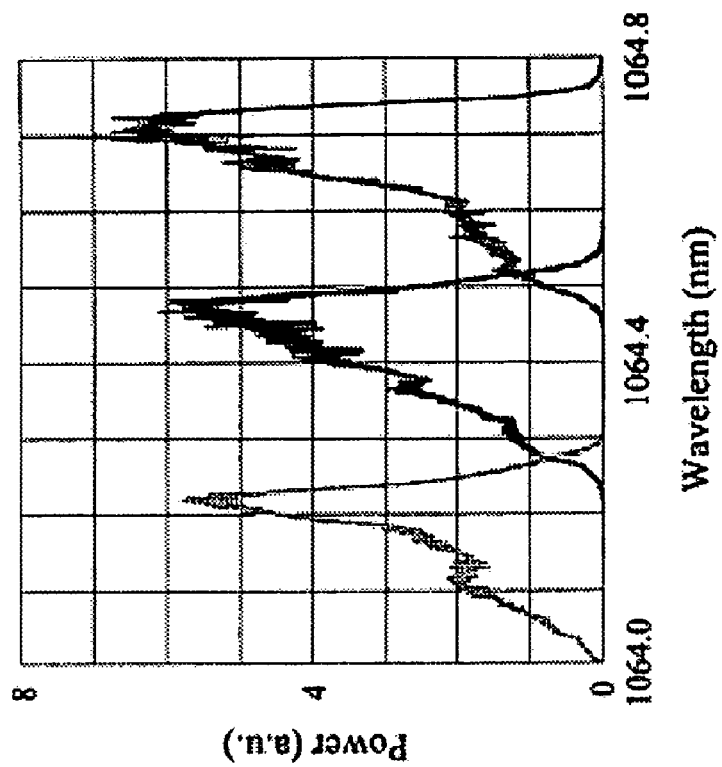
FIG. 16 demonstrates the wavelength tuning using the chirping of the Bragg reflector.
Figure 15:
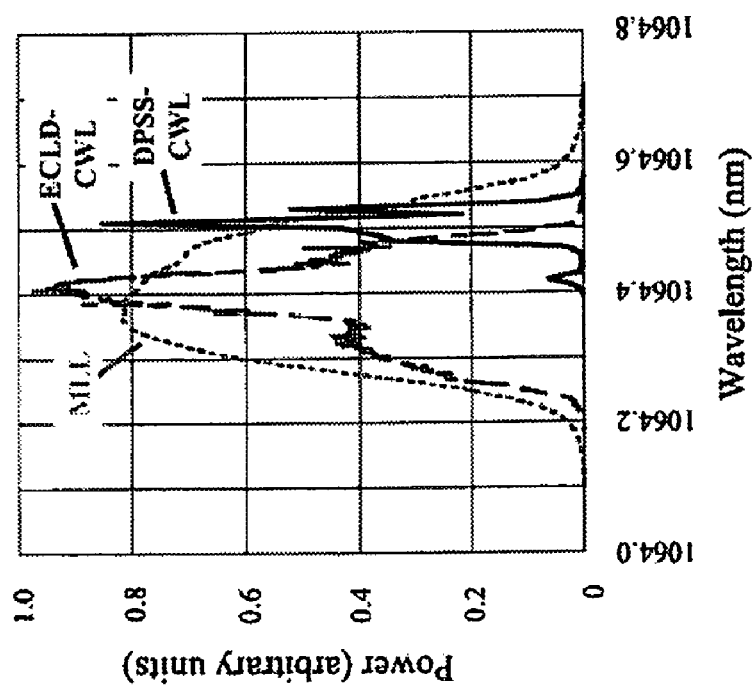
FIG. 15 depicts the wavelength spectra as measured using a 10 ps MLL, a prior art CWL, and a prototype of the novel ECLD-CWL.

By way of example, FIG. 15 depicts the wavelength spectra as measured using a 10 ps MLL, a prior art CWL, and a prototype of the novel ECLD-CWL. As can be easily seen, the spectra of the prior art CWL does not match that of the MLL. On the other hand, a much better match is enabled by the novel ECLD-CWL, which enables optimizing the performance of the dual-laser noise reduction scheme. Also, FIG. 16 demonstrates the wavelength tuning using the chirping of the Bragg reflector. Using this tuning the ECLD-CWL can be tailor-tuned to the MLL.

Figure 17:
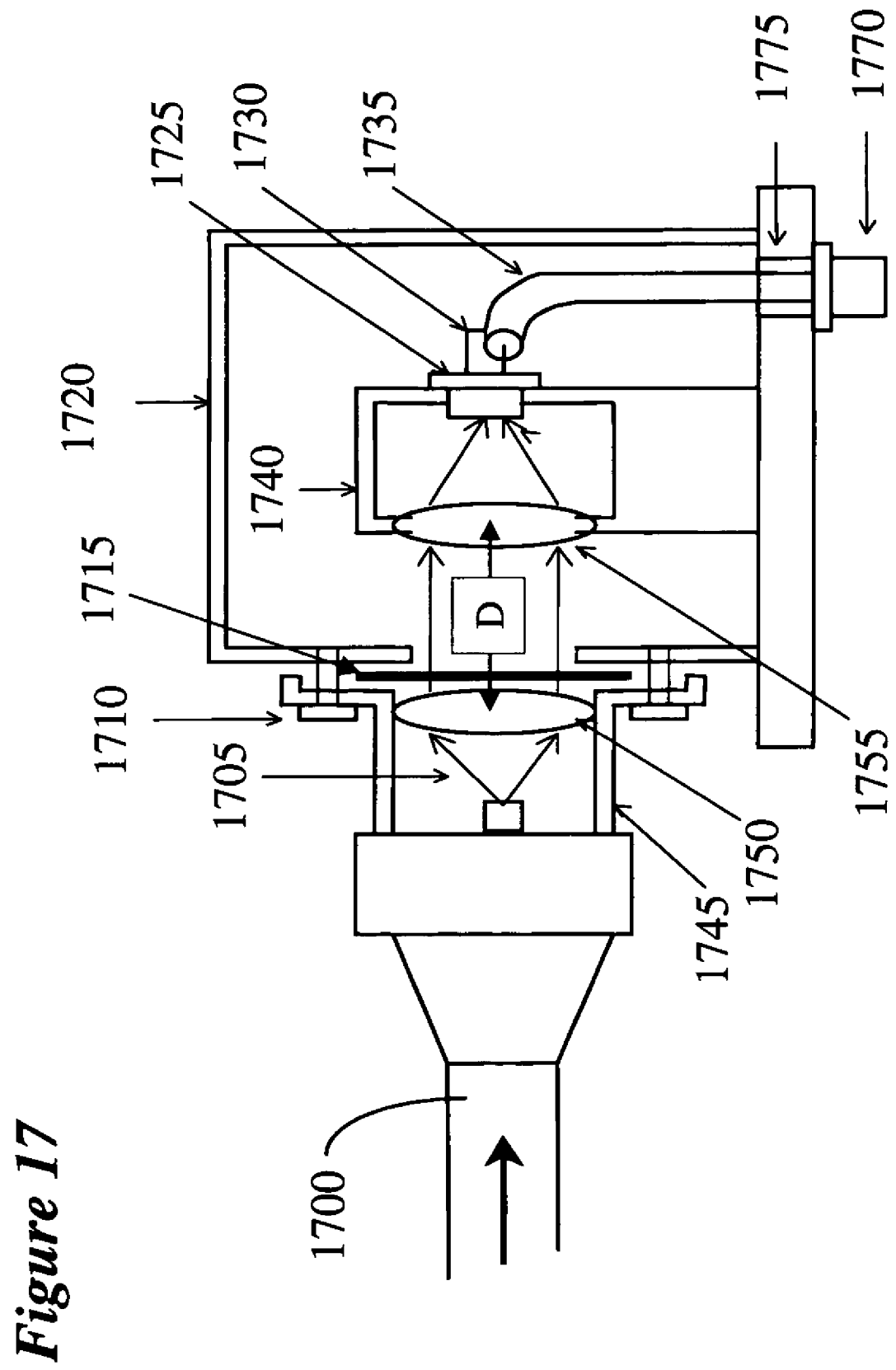
FIG. 17 depicts a fiber to photodetector coupling embodiment that enables tuning the two path lengths.

As can be understood from the above description, the common-path PDP optics provides a reference and probing optical paths that are inherently of the same length. However, when two detectors are used for differential probing, some path length difference may be introduced by the fiber optics and the other optical elements. FIG. 15 depicts an optional fiber to photodetector coupling embodiment that enables tuning for matching the two optical path lengths. This coupling is optional because in embodiments where slow electronics is used, the pulse width of the MLL is stretched to ns or microsecond range. Consequently, fine path matching is not necessary. Also, when it is beneficial to avoid introducing unnecessary optical elements into the beam path, this coupling may be omitted and the light from the fiber (angle polished to avoid back-reflection problems) may be directly coupled to the photodetector by placing the fiber in close proximity to the detector. In FIG. 17, a multimode fiber 1700 is coupled to the photodetector chamber 1720 via beam collimator module 1745. The photodetector chamber 1720 houses a photodetector holder 1740, upon which a focusing lens 1755 and an APD 1725 are mounted. A coaxial cable 1735 is connected to the photodetector leads 1730 and to an SMA connector 1770, through a ceramic feed-through 1775.

The fiber collimator module includes a collimator lens 1750, which receives the fiber output beam 1705 and collimates it. The collimated light is directed towards the focusing lens 1755 using x-y alignment screws 1710. Since the light between the collimating lens 1750 and focusing lens 1755 is collimated, changing the separation between these lenses, i.e., distance D, will not cause degradation or changes in the optical signal. Therefore, changing this distance, e.g., by turning alignment screws 1710 equal amounts, enables matching the optical path of each beam to balance the reference and probing beams. An alignment O-ring 1715 assists in maintaining the fiber collimator module in the tuned position once balance is achieved.

Figure 18:
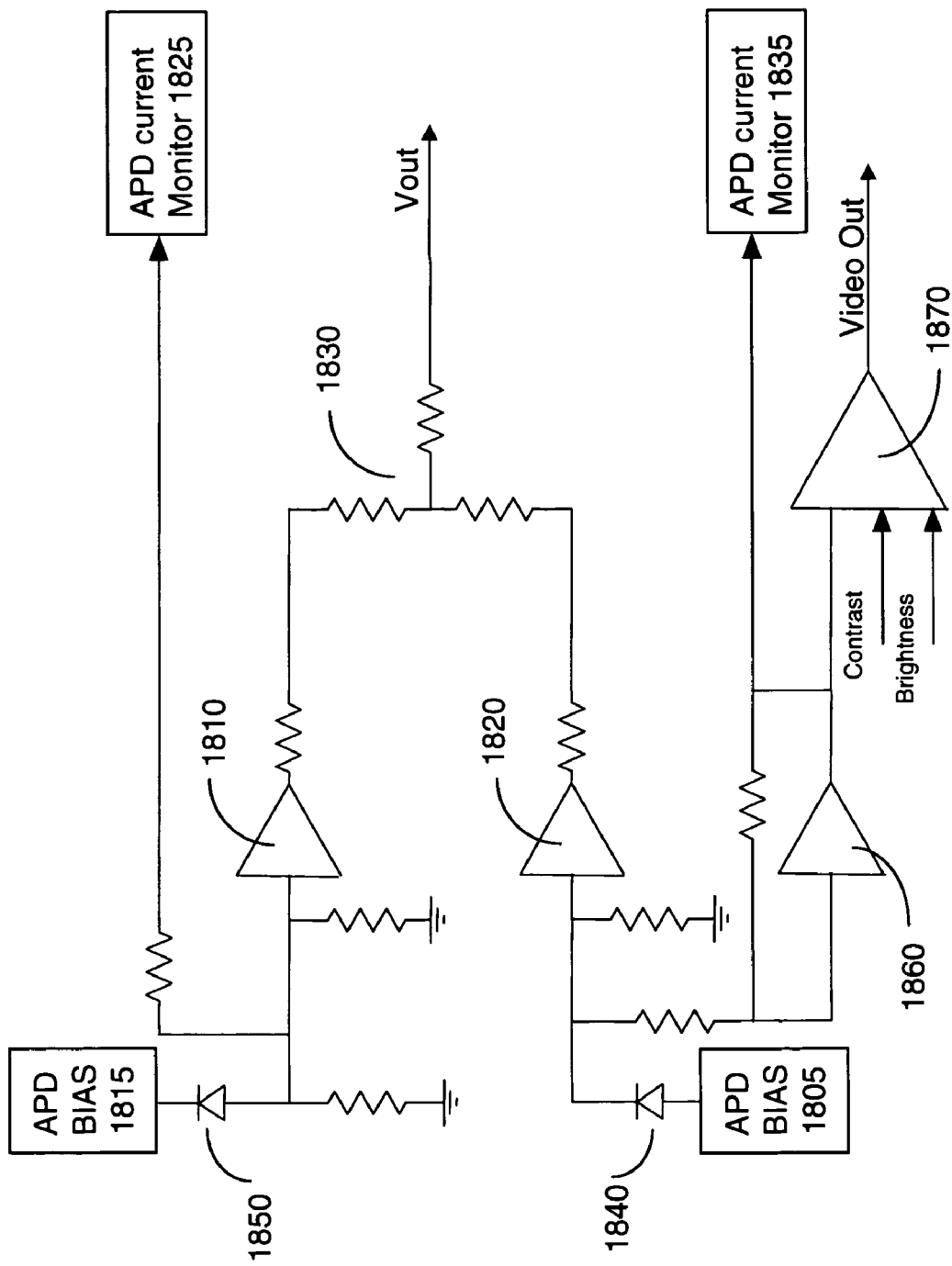
FIG. 18 depicts an embodiment of receiver electronics for a two photodetectors, differential detection mode.

FIG. 18 depicts an embodiment of receiver electronics for a two photodetectors, differential signal detection mode (reflected-A and reflected-B signals subtracted). For an increase in light intensity of the probing signal, two photodiodes are used in a differential signal detection mode. One diode produces a positive going signal at its amplifier input, while the other one produces a negative signal. Summing the two output signals produces an enhanced differential signal. As shown in FIG. 18, APD 1840 is negatively biased by APD bias 1805, and its current is monitored by current monitor 1835. In this embodiment, the bias is set to about −60V. The other APD 1850 is positively biased by bias 1815 to approximately the same, but opposite value of bias 1805 (e.g., +60V), and its current is monitored by current monitor 1825. Monitoring the current of both APD's assists in checking the balance of the PDP optics, as the variable phase plate of the PDP can be adjusted until the same current is observed by the two current monitors 1825 and 1835. Optionally, a closed-loop feedback may be implemented to control the variable phase plate setting automatically in order to maintain a particular balance setting of the two signals. That is, the setting can be controlled so that the two signals are equal, or have a deliberate misbalance when desired.

The signal from APD 1840 is applied to amplifier 1820, while the signal from APD 1850 is applied to amplifier 1810. The output of both amplifiers are applied to a simple resistive summing junction 1830 to effectively add the two APD signals together and provide a probing signal Vout. The probing signal is sent to a digitizer for data storage and processing.

During navigation, signal from only one APD is required to obtain an image of the DUT. As is shown, the signal from APD 1840 is also sent to amplifier 1860 and therefrom to video amplifier 1870, which provides a video out signal for processing and display. Other imaging methods may be performed with the resulting advantageous features as follows. In order to provide contrast control, the variable retarder may be varied to tune the retardation so that the image contrast is varied to the desired result. Additionally, imaging may be performed using both APD's and the resulting images subtracted from each other so as to obtain a difference image.

In the various embodiments disclosed where two APD's are used, the APD's gain may be advantageously controlled to, first, balance the APD's response and, second, to improve the imaging. Using a controllable variable power supply that is manually or automatically controlled, the voltage/gain response of each APD can be determined. Then, using the learned voltage/gain response, the gain of each APD can be controlled to a desired value by selecting the appropriate voltage on the corresponding power supply. For balancing the system, the following procedure may be used. First, the voltage of the power supplies of each APD is set to result in the same gain provided by both APD's, thereby balancing the output of the APD's. Then, the variable wave plate is adjusted until the current output of both ADP's is the same, thereby balancing the optical path. The variable gain can also be used for improved imaging. For example, when the image scan goes from a relatively dark area to a relatively bright area, the gain of the APD's may be reduced so as not to saturate the image. Conversely, when moving from a bright area to a dark area, the gain may be increased to provide improved contrast and detail.

Figure 19:
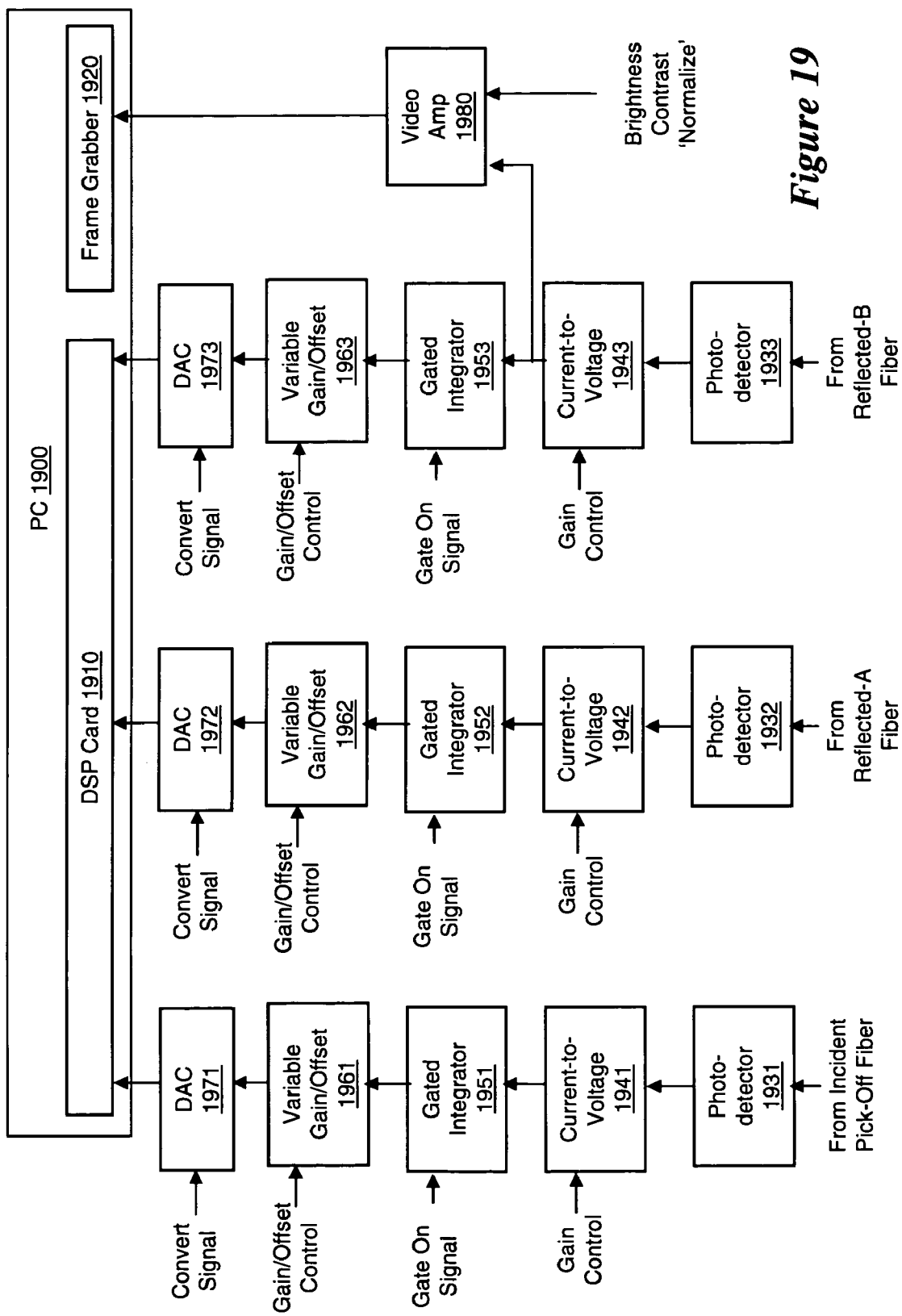
FIG. 19 shows block diagram of another scheme where signals are not summed or differenced in analog, but digitized individually.

FIG. 19 shows block diagram of another scheme where signals are not summed in analog, but digitized individually. This allows the signals to be summed, subtracted, divided, etc. This arrangement does not require the exquisite balancing necessary for analog subtraction to work. It also gives greater flexibility. For example, the ratio of reflected A/reflected B gives pure PDP signal, but this arrangement also enables other ratios, such as reflected A/Incident pick-off and/or reflected B/Incident pick-off simultaneously. The user may try various signals and then chose which provides the best result for a particular investigation.

In the embodiment of FIG. 19, a computer, such as a programmed personal computer PC 1900 is equipped with a digital signal processing card DSP 1910 and a frame grabber 1920. In this embodiment, three channels, CH1, CH2, and CH3, provide signals to the DSP 1910. In this embodiment the three channels comprise the same elements, so the description proceeds with describing only channel CH1. Channel CH1 comprises photodetector 1931 which receives a light signal from a fiber optics and outputs an electrical signal.

The electrical output of the photodetector 1931 is applied to current to voltage converter 1941 which has variable transimpedance gain control. The output of the current to voltage converter is then applied to a gated integrator 1951, which is responsive to a gate on signal. The signal from the gated integrator 1951 is applied to a variable gain/offset circuit 1961 to enable gain/offset control. The signal from the gain/offset circuitry 1961 is then applied to a digital/analog converter DAC 1971 to convert the analog signal into a digital signal. Variable gain/offset circuit 1961 allows signal applied to DAC 1971 to be within the input range of the DAC. In this embodiment, a 14 bit DAC converter with internal sample/hold feature is used. The digital output is then provided to the DSP card for processing.

As is shown in FIG. 19, channel CH1 is used to monitor the output of the laser source and it receives the signal from the pick-off fiber as explained above. Channels CH2 and CH3, on the other hand, are used for the probing and receive the reflected signals Reflected-A and Reflected-B, respectively. Additionally, one of the channels, in this illustration channel CH3 is also used for imaging by applying the output of its current to voltage converter to a video amplifier 1980, the output of which is applied to the frame grabber 1920. The quality of the image may be adjusted by a brightness/contrast (or black level/gain) signal applied to the video amplifier.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. A system for investigating the operation of a transistor in an integrated circuit microchip using laser probing, comprising:

a laser source providing a laser beam;

a beam optics comprising a polarizer polarizing said beam in a vertical direction so as to provide a vertically polarized beam, and a rotator rotating said vertically polarized beam through a predetermined angle so as to provide a polarized-rotated beam consisting of a vertically polarized component and a horizontally polarized component;

an optical retarder positioned to receive the polarized-rotated beam and retard one of said vertically and horizontally polarized components with respect to the other;

a beam pointing optics receiving said polarized-rotated beam from the optical retarder and transmitting said vertically and horizontally polarized components along the same optical path while pointing the vertically and horizontally polarized components onto the transistor in alignment with the gate length and gate width of the transistor and;

a first photodetector receiving at least a portion of reflected laser light that is reflected from said microchip and providing an electrical signal;

collection electronics receiving the electrical signal from said photodetector and providing an output signal;

an analysis system receiving and analyzing said output signal.

2. The system of claim 1, wherein said angle is about 45 degrees from said vertical direction.

3. The system of claim 2, wherein said laser source is a mode-locked laser (MLL).

4. The system of claim 2, wherein said laser source is a pulsed laser.

5. The system of claim 3, further comprising a continuous wave (CW) laser source.

6. The system of claim 5, wherein laser output of said CW laser is pulsed.

7. The system of claim 6, wherein said CW laser comprises a wavelength-tunable, external cavity, laser source.

8. The system of claim 7, wherein said CW laser source is wavelength matched to said MLL.

9. The system of claim 7, wherein said CW laser source comprises a laser diode, a Bragg deflector, a Faraday isolator, and a drive circuit.

10. The system of claim 9, wherein said drive circuit drives said laser diode with a continuous or pulsed drive signal, selectively.

11. The system of claim 1, further comprising a second photodetector receiving a second portion of said reflected laser light that is reflected from said microchip, and providing a second electrical signal.

12. The system of claim 11, wherein said output signal comprises a differential of said electrical signal and said second electrical signal.

13. The system of claim 11, wherein said output signal comprises a ratio of said electrical signal and said second electrical signal.

14. The system of claim 11, wherein said output collection electronics comprises analog to digital converter.

15. An optical system for investigating the operation of a transistor in an integrated circuit, comprising:
   a laser source providing a laser beam;
   a polarizer receiving said laser beam and providing a polarized laser beam aligned in a first direction;
   a faraday rotator receiving said polarized laser beam and rotating the polarized laser beam to provide a rotated-polarized beam aligned in a second direction;
   an optical retarder partially retarding said rotated-polarized beam, the optical retarder having its axes aligned with gate width and gate length of the transistor;
   an objective lens directing said rotated-polarized beam onto a specimen;
   an optical deflector for deflecting at least part of a reflection of said rotated-polarized beam from said specimen.

16. The system of claim 15, wherein said deflector comprises a first beam splitter.

17. The system of claim 16, further comprising a second beam splitter deflecting a remainder of said reflection.

18. The system of claim 17, further comprising a first and a second photodetectors receiving deflected reflection from said first and second beam splitters, respectively.

19. The system of claim 15, wherein said laser source comprise a mode-locked laser (MLL) and a continuous-wave (CW) laser sources.

20. The system of claim 19, wherein the output of said CW laser source is pulsed.

21. The system of claim 20, wherein said CW laser source comprises wavelength-tunable, external cavity laser source.

22. The system of claim 21, further comprising a drive electronics circuit selectively applying to said CW laser source a pulsed or continuous drive signal.

23. The system of claim 21, wherein said CW laser source comprises a laser diode, a Bragg deflector, a Faraday isolator, and a drive circuit.

24. The system of claim 15, wherein said first direction is aligned with either the gate width or the gate length of said transistors.

25. A method for investigating the operation of a transistor in an integrated circuit microchip using laser probing, comprising:
   generating a pulsed laser beam;
   polarizing said pulsed laser beam in a first direction aligned with one of gate width or gate length of the transistor, so as to provide a polarized-pulsed laser beam;
   rotating said polarized-laser beam so as to provide a rotated laser beam aligned in a second direction;
   partially retarding said rotated laser beam;
   focusing said rotated laser beam onto the transistor in said microchip; and
   sensing beam reflection from said microchip.

26. The method of claim 25, wherein generating a pulsed laser beam comprises driving a mode-locked laser (MLL) and simultaneously driving a continuous-wave laser (CWL), and superimposing the output of said MLL and CWL.

27. The method of claim 26, further comprising pulsing the output of said CWL.

28. The method of claim 27, wherein said pulsing comprises driving said CWL with a pulsed driving signal.

29. The method of claim 26, further comprising wavelength matching the wavelength of said CWL to that of said MLL.

30. The method of claim 25, wherein said retarding comprises phase-shifting part of said beam by $\pi/2$.

* * * * *